US008536589B2

(12) United States Patent
Matsushima

(10) Patent No.: US 8,536,589 B2
(45) Date of Patent: *Sep. 17, 2013

(54) DISPLAY DEVICE FOR CONTROLLING AN ORGANIC LIGHT EMITTING LAYER THICKNESS

(75) Inventor: Hideaki Matsushima, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/091,667

(22) Filed: Apr. 21, 2011

(65) Prior Publication Data

US 2011/0198624 A1 Aug. 18, 2011

(51) Int. Cl.
 *H01L 29/18* (2006.01)
 *H01L 33/00* (2010.01)
 *H01J 1/62* (2006.01)
 *H01J 63/04* (2006.01)

(52) U.S. Cl.
 USPC .............................. 257/88; 438/34; 313/498

(58) Field of Classification Search
 None
 See application file for complete search history.

(56) References Cited

U.S. PATENT DOCUMENTS

| 5,443,922 | A | 8/1995 | Nishizaki et al. |
| 6,388,377 | B1 | 5/2002 | Kobayashi et al. |
| 6,559,604 | B2 * | 5/2003 | Lu et al. ................. 315/169.3 |
| 6,762,552 | B1 * | 7/2004 | Duineveld et al. ............ 313/506 |
| 7,034,453 | B2 | 4/2006 | Kai et al. |
| 7,038,651 | B2 | 5/2006 | Nitta et al. |
| 7,332,854 | B2 | 2/2008 | Kai et al. |
| 7,352,350 | B2 | 4/2008 | Nitta et al. |
| 7,642,701 | B2 | 1/2010 | Kai et al. |
| 7,994,711 | B2 | 8/2011 | Nakamura et al. |
| 8,129,902 | B2 | 3/2012 | Kai et al. |
| 8,193,699 | B2 | 6/2012 | Fujioka et al. |
| 2002/0064966 | A1 | 5/2002 | Seki et al. |
| 2002/0079833 | A1 | 6/2002 | Kobayashi et al. |
| 2003/0179221 | A1 | 9/2003 | Nitta et al. |

(Continued)

FOREIGN PATENT DOCUMENTS

| JP | 05-163488 | 6/1993 |
| JP | 2002-222695 | 8/2002 |

(Continued)

OTHER PUBLICATIONS

U.S. Appl. No. 13/091,652 to Hideaki Matsushima, filed Apr. 21, 2011.

(Continued)

*Primary Examiner* — Evan Pert
*Assistant Examiner* — Andres Munoz
(74) *Attorney, Agent, or Firm* — Greenblum & Bernstein, P.L.C.

(57) ABSTRACT

A display device includes an array of light emitting cells. Each light emitting cell includes first and second electrodes, and an organic light emitting layer located between the first and second electrodes. Banks are above the first electrode that partition the organic light emitting layer to define each of the light emitting cells. First and second light emitting cells are adjacent to one another and located in a peripheral region of the array. The first light emitting cell is closer to a center of the array than the second light emitting cell. A first bank borders the first light emitting cell and the second light emitting cell. An inclination angle of an innermost sidewall of the first bank that is adjacent the first light emitting cell is greater than an inclination angle of an outermost sidewall of the first bank that is adjacent the second light emitting cell.

14 Claims, 19 Drawing Sheets

(56) References Cited

U.S. PATENT DOCUMENTS

| | | | |
|---|---|---|---|
| 2004/0021413 A1* | 2/2004 | Ito et al. | 313/504 |
| 2004/0119419 A1 | 6/2004 | Kai et al. | |
| 2004/0166761 A1 | 8/2004 | Seki et al. | |
| 2005/0237780 A1* | 10/2005 | Sakai | 365/111 |
| 2005/0264186 A1 | 12/2005 | Seki et al. | |
| 2005/0264187 A1 | 12/2005 | Seki et al. | |
| 2005/0266169 A1 | 12/2005 | Seki et al. | |
| 2006/0158107 A1 | 7/2006 | Kai et al. | |
| 2006/0176261 A1 | 8/2006 | Nitta et al. | |
| 2007/0018152 A1 | 1/2007 | Seki et al. | |
| 2007/0029929 A1 | 2/2007 | Nakamura et al. | |
| 2007/0241664 A1 | 10/2007 | Sakamoto et al. | |
| 2008/0036374 A1* | 2/2008 | Okano | 313/506 |
| 2008/0290789 A1 | 11/2008 | Kai et al. | |
| 2008/0315760 A1 | 12/2008 | Seki et al. | |
| 2009/0009075 A1 | 1/2009 | Seki et al. | |
| 2009/0160322 A1* | 6/2009 | Yoshida et al. | 313/504 |
| 2009/0284144 A1 | 11/2009 | Fujioka et al. | |
| 2009/0302333 A1 | 12/2009 | Seki et al. | |
| 2010/0102343 A1 | 4/2010 | Ono et al. | |
| 2010/0164372 A1 | 7/2010 | Kai et al. | |
| 2011/0180821 A1 | 7/2011 | Matsushima | |
| 2011/0198623 A1 | 8/2011 | Matsushima | |
| 2012/0025699 A1 | 2/2012 | Okumoto et al. | |
| 2012/0091440 A1 | 4/2012 | Matsushima | |
| 2012/0091441 A1 | 4/2012 | Matsushima | |
| 2012/0091483 A1 | 4/2012 | Matsushima | |
| 2012/0138973 A1 | 6/2012 | Matsushima | |
| 2012/0193658 A1 | 8/2012 | Matsushima | |

FOREIGN PATENT DOCUMENTS

| | | |
|---|---|---|
| JP | 2002-358983 | 12/2002 |
| JP | 2004-192935 | 7/2004 |
| JP | 2005-267984 | 9/2005 |
| JP | 2006-140205 | 6/2006 |
| JP | 2006-185869 | 7/2006 |
| JP | 2007-073499 | 3/2007 |
| JP | 2007-165167 | 6/2007 |
| JP | 2007-287354 | 11/2007 |
| JP | 2007-310156 | 11/2007 |
| JP | 2007-311235 | 11/2007 |
| JP | 2009-54608 | 3/2009 |
| JP | 2009-277578 | 11/2009 |
| JP | 2009-277590 | 11/2009 |
| WO | 99/12397 | 3/1999 |
| WO | 2008/105153 | 9/2008 |

OTHER PUBLICATIONS

U.S. Appl. No. 13/082,674 to Hideaki Matsushima, filed Apr. 8, 2011.
International Search Report in PCT/JP2009/007092, mailing date of Mar. 2, 2010.
International Search Report in PCT/JP2010/006126, mail date is Jan. 18, 2011.
International Search Report in PCT/JP2010/006139, mail date is Jan. 18, 2011.
International Search Report in PCT/JP2010/006144, mail date is Jan. 18, 2011.
International Search Report in PCT/JP2010/006145, mail date is Jan. 18, 2011.
U.S. Appl. No. 13/434,070 to Hideaki Matsushima, filed Mar. 29, 2012.
U.S. Appl. No. 13/313,214 to Hideaki Matsushima, filed Dec. 7, 2011.
U.S. Appl. No. 13/309,775 to Hideaki Matsushima, filed Dec. 2, 2011.
U.S. Appl. No. 13/309,768 to Hideaki Matsushima, filed Dec. 2, 2011.
U.S. Appl. No. 13/313,206 to Hideaki Matsushima, filed Dec. 7, 2011.
International Search Report in PCT/JP2009/007118, mailing date of Mar. 2, 2010.
International Search Report in PCT/JP2009/007082, mailing date of Mar. 2, 2010.
International Search Report in PCT/JP2010/006149, mailing date of Dec. 28, 2010.
United States Office Action in U.S. Appl. No. 13/082,674, dated Oct. 17, 2012.
International Search Report in PCT/JP2010/006125, mailing date of Dec. 7, 2010.
International Search Report in PCT/JP2010/006143, mailing date of Jan. 11, 2011.
International Preliminary Examination Report in PCT/JP2010/006125, mailing date of Dec. 12, 2011.
International Preliminary Examination Report in PCT/JP2010/006143, mailing date of Dec. 8, 2011.

* cited by examiner

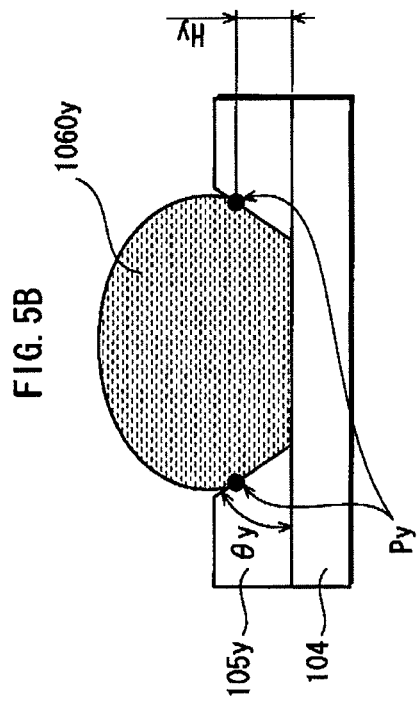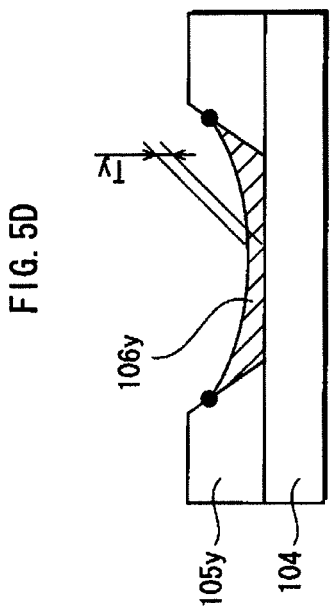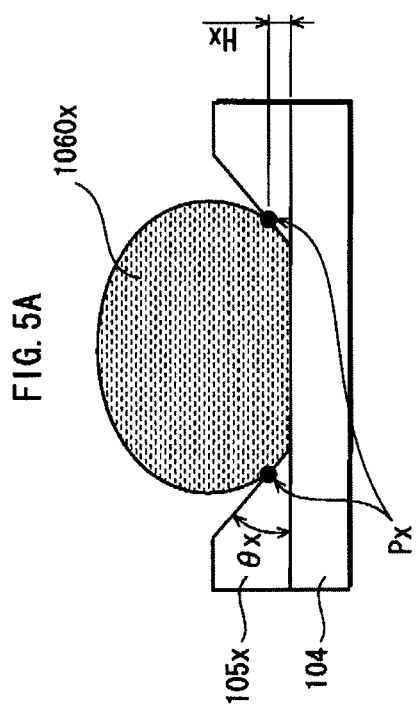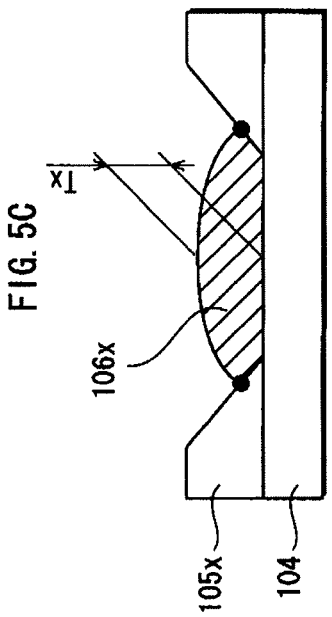

FIG. 6

| Taper angle (θ) | Small ⟵⟶ Large |
|---|---|
| Pinning location (H) | Lower ⟵⟶ Higher |
| Film thickness (T) | Thicker ⟵⟶ Thinner |

FIG. 7
| | Sample 1 | Sample 2 | Sample 3 |
|---|---|---|---|
| Bank height [μm] | 0.3 | 0.5 | 0.6 |
| Contact angle [°] | — | 55 | 44 |
| Taper angle [°] | 28 | 22 | 24 |
| Film thickness distribution | 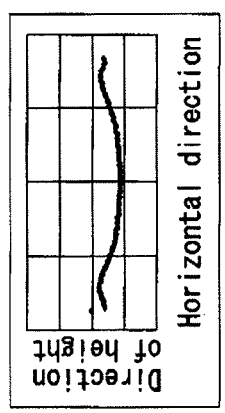 | 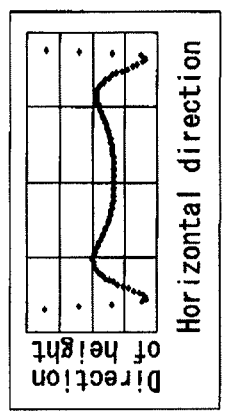 | 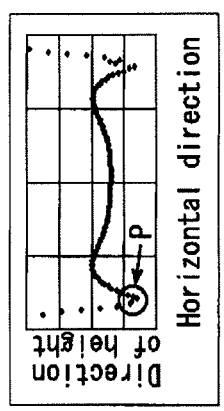 |

FIG. 8
| | Sample 4 | Sample 5 |
|---|---|---|
| Bank height [μm] | 0.7 | 1.0 |
| Contact angle [°] | 43 | 47 |
| Taper angle [°] | 28 | 50 |
| Film thickness distribution | 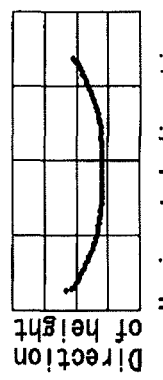 | 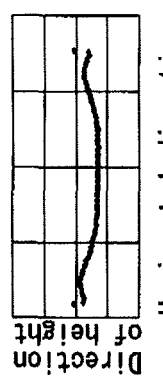 |

FIG. 12A
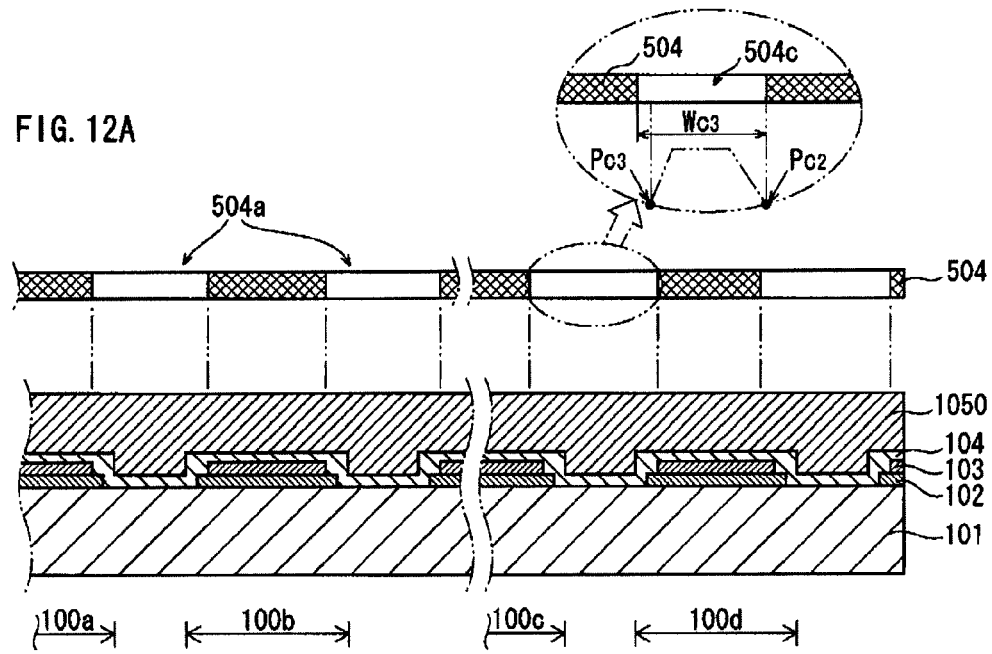
FIG. 12B
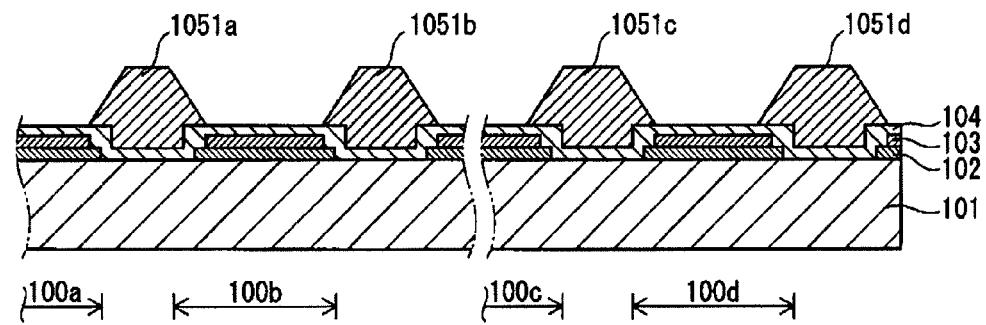
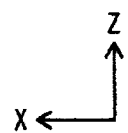

FIG. 13A
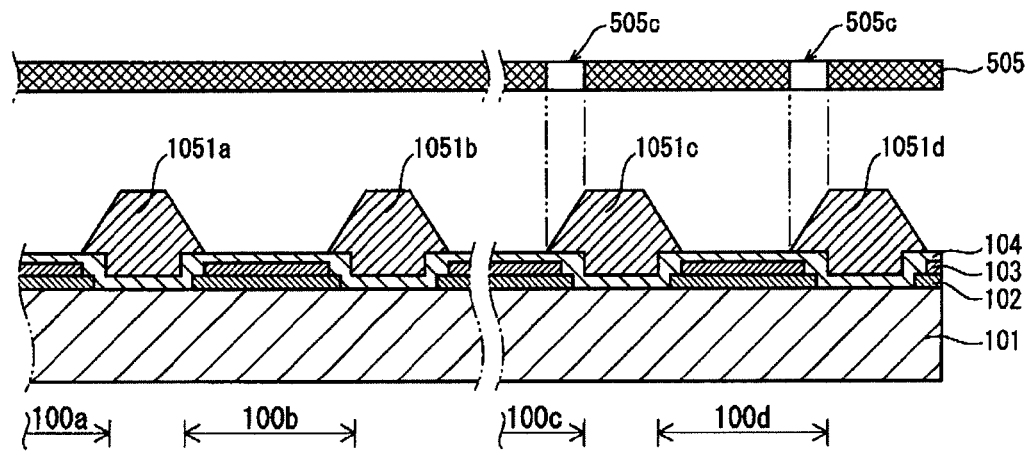
FIG. 13B
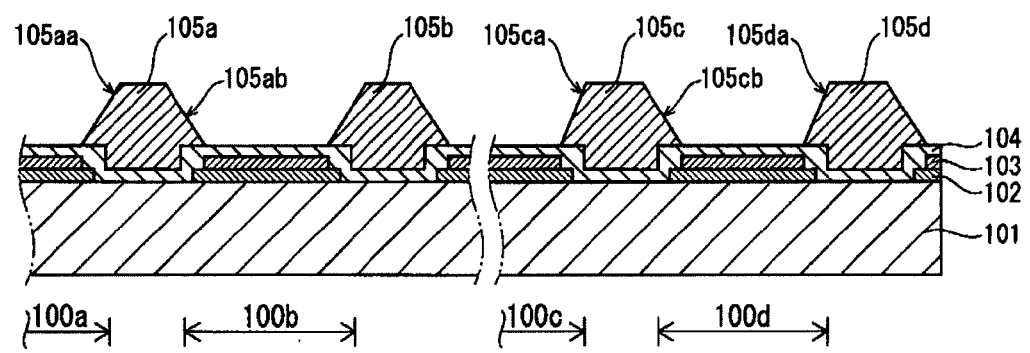
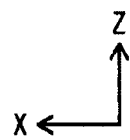

DISPLAY DEVICE FOR CONTROLLING AN ORGANIC LIGHT EMITTING LAYER THICKNESS

CROSS REFERENCE TO RELATED APPLICATION

This is a continuation application of PCT Application No. PCT/JP09/007,092 filed Dec. 22, 2009, designating the United States of America, the disclosure of which, including the specification, drawings and claims, is incorporated herein by reference in its entirety.

1. Field Of The Invention

The present invention relates to a display device and a manufacturing method thereof, and in particular to a display device provided with an organic light emitting layer and a manufacturing method thereof.

2. Description Of The Related Art

In recent years, progress has been made in the research and development of display devices that use the phenomenon of electroluminescence occurring in organic material. Each light emitting cell of such a display device is composed of an anode and a cathode with an organic light emitting layer therebetween. When the display device is driven, light is produced when holes and electrons recombine within the organic light emitting layer after injecting holes through the anode and injecting electrons through the cathode.

Banks composed of insulating material partition the organic light emitting layer of adjacent light emitting cells. The organic light emitting layer is formed by dripping ink that includes organic light emitting material into each region partitioned by the banks and drying the ink.

Maintaining a uniform film thickness in the organic light emitting layer formed in this way, however, is problematic.

To even out the film thickness of the organic light emitting layer, Patent Literature 1 for example recites an invention to provide a convexity on the inner surface of the bank in order to control the pinning location of the ink. In other words, using the technology suggested in Patent Literature 1, the pinning location when ink is dripped in one light emitting cell can be set to the convexity. To a certain degree, uniform film thickness can thus be guaranteed.

3. Patent Literatures

Patent Literature 1: Japanese Patent Application Publication No. 2007-311235

SUMMARY OF INVENTION

It is considered difficult, however, to use the technology suggested in Patent Literature 1 over the entire panel of a display device (central region, peripheral region) to form a minute convexity on the inner surface of the bank to a high degree of precision in accordance with each panel region. Therefore, it is not easy to maintain the organic light emitting layer at a uniform film thickness over the entire panel of a display device (central region, peripheral region).

It is an object of the present invention to solve the above problems by providing a display device, and a manufacturing method thereof, that has a uniform film thickness in the organic light emitting layer in the light emitting cells at the peripheral region of the panel and that has an even luminance within the panel.

In order to solve the above problems, a display device according to an aspect of the present invention has the following structure.

A display device according to one aspect of the present invention comprises an array of a plurality of light emitting cells. The light emitting cells are composed of a first electrode, a second electrode, and an organic light emitting layer located between the first electrode and the second electrode. In the display device according to an aspect of the present invention, a plurality of banks is arranged above the first electrode so as to partition the organic light emitting layer into the light emitting cells. The light emitting cells include a first light emitting cell and a second light emitting cell that are located in a peripheral region of the array and are adjacent to one another in the array. The banks include a first bank that borders the first light emitting cell and the second light emitting cell.

In the display device according to an aspect of the present invention, in the first bank, a first side wall facing the first light emitting cell has a larger inclination angle than a second side wall facing a second light emitting cell.

In the display device according to an aspect of the present invention, in the first bank formed in the peripheral region of the array, the first side wall facing the first light emitting cell has a larger inclination angle than the second side wall facing the second light emitting cell. Accordingly, when ink is dripped during manufacturing, a pinning location of the ink on the first side wall becomes higher than a pinning location of the ink on the second side wall. Therefore, during the drying process, the film thickness of the organic light emitting layer in the first light emitting cell at the first side wall tends to become thinner than the film thickness of the organic light emitting layer in the second light emitting cell at the second side wall.

However, as described above, the film thickness of the organic light emitting layer after drying tends to become thicker at the first side wall in the first light emitting cell than at the second side wall in the second light emitting cell, due to non-uniformity of vapor concentration distribution. Therefore, in the display device according to an aspect of the present invention, a reduction in film thickness caused by enlarging the inclination angle of the first side wall offsets the effect whereby the film thickness of the organic light emitting layer becomes thicker at the first side wall due to non-uniformity of vapor concentration distribution. It is thus possible to maintain a uniform film shape in the organic light emitting layer of the light emitting cell located at a peripheral region of the panel.

Accordingly, in the display device according to an aspect of the present invention, the film shape of the organic light emitting layer in the light emitting cell located at the peripheral region of the panel can be made uniform, and luminance can be made even.

BRIEF DESCRIPTION OF THE DRAWINGS

FIG. 5A is a schematic cross-section diagram showing pinning locations when the taper angle of the bank side wall is small; FIG. 5B is a schematic cross-section diagram showing pinning locations when the taper angle of the bank side wall is large; FIG. 5C is a schematic cross-section diagram showing the condition of the organic light emitting layer after drying when the taper angle of the bank side wall is small; and FIG. 5D is a schematic cross-section diagram showing the condition of the organic light emitting layer after drying when the taper angle of the bank side wall is large.

FIG. 6 summarizes the relationship between the inclination angle of the bank (taper angle) θ, the pinning height H, and the film thickness T of the organic light emitting layer.

FIG. 7 shows a distribution of film thickness of the organic light emitting layer in samples 1-3.

FIG. 8 shows a distribution of film thickness of the organic light emitting layer in samples 4 and 5.

FIGS. 12A and 12B are schematic cross-section diagrams showing, in order, the main processes in the manufacturing method of Modification 2.

FIGS. 13A and 13B are schematic cross-section diagrams showing, in order, the main processes in the manufacturing method of Modification 2.

DESCRIPTION OF THE PREFERRED EMBODIMENT(S)

Figure 1:
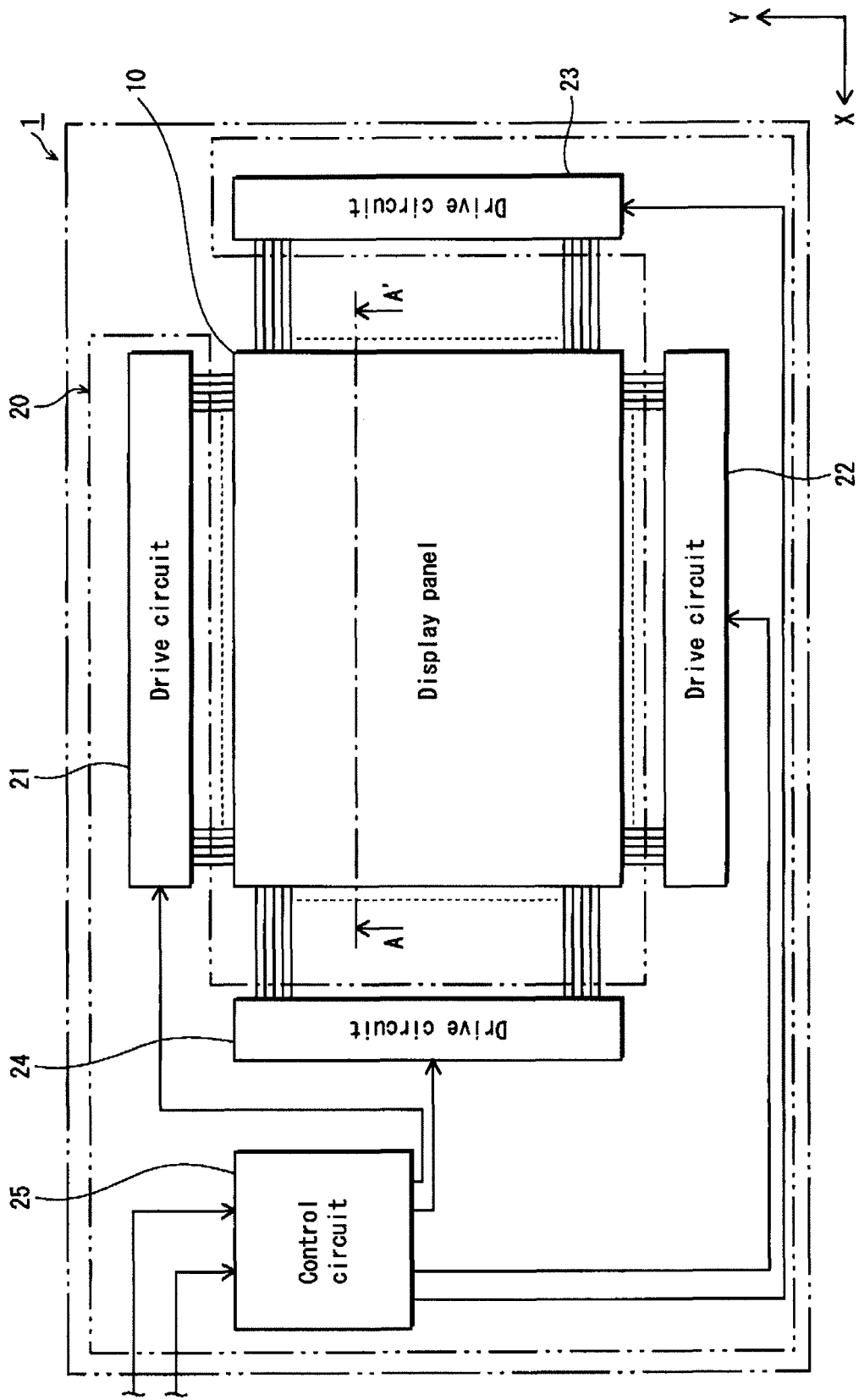
FIG. 1 is a block diagram showing the configuration of a display device 1 according to the Embodiment of the present invention.

A display device according to one aspect of the present invention comprises an array of a plurality of light emitting cells. The light emitting cells are composed of a first electrode, a second electrode, and an organic light emitting layer located between the first electrode and the second electrode. In the display device according to an aspect of the present invention, a plurality of banks is arranged above the first electrode so as to partition the organic light emitting layer into the light emitting cells. The light emitting cells include a first light emitting cell and a second light emitting cell that are located in a peripheral region of the array and are adjacent to one another in the array. The banks include a first bank that borders the first light emitting cell and the second light emitting cell.

In the display device according to an aspect of the present invention, in the first bank, a first side wall facing the first light emitting cell has a larger inclination angle than a second side wall facing a second light emitting cell.

In the display device according to an aspect of the present invention, in the first bank, which borders adjacent light emitting cells located in the peripheral region of the array, the inclination angle of the first side wall is larger than the inclination angle of the second side wall. Accordingly, when ink is dripped during formation of the organic light emitting layers, a pinning location of the ink on the first side wall becomes higher than a pinning location of the ink on the second side wall. Specifically, the pinning location at the first side wall, which has a relatively large inclination angle, becomes higher than the pinning location at the second side wall, which has a relatively small inclination angle. At the first bank, the film thickness of the organic light emitting layer after drying tends to become thicker at the location corresponding to the first side wall than at the location corresponding to the second side wall.

This reduction in film thickness accompanying the change in pinning location by making the inclination angle of the first side wall larger than the inclination angle of the second side wall offsets an increase in film thickness where solvent flows to minimize surface free energy during drying. Therefore, the film shape of the organic light emitting layer in all of the light emitting cells, including the light emitting cells at the peripheral region of the array, can be made uniform.

Accordingly, in the display device according to an aspect of the present invention, the film shape of the organic light emitting layer in all of the light emitting cells can be made uniform, and luminance can be made even.

In the display device according to one aspect of the present invention, in the above structure, a third light emitting cell and a fourth light emitting cell that are located in a central region of the array and are adjacent to one another in the array may be further considered. In this case, the banks include a second bank that borders the third light emitting cell and the fourth light emitting cell. In the above structure, an inclination angle of a third side wall facing the third light emitting cell in the second bank may be formed to be equivalent to an inclination angle of a fourth side wall facing the fourth light emitting cell in the second bank.

Figure 17A:
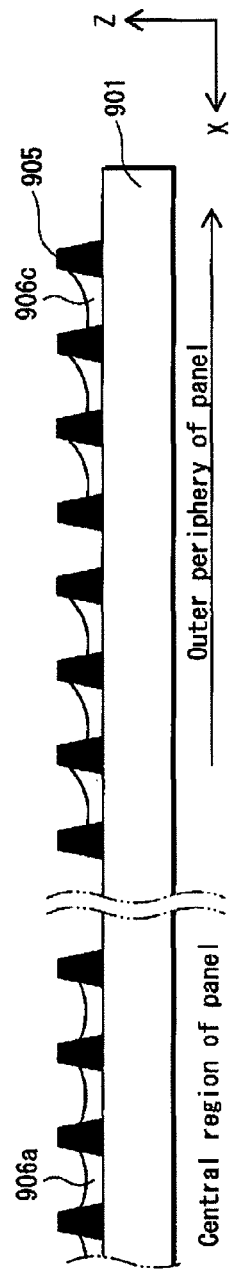
FIG. 17A is a schematic cross-section diagram showing the organic light emitting layer in a display panel according to conventional technology.
Figure 17B:
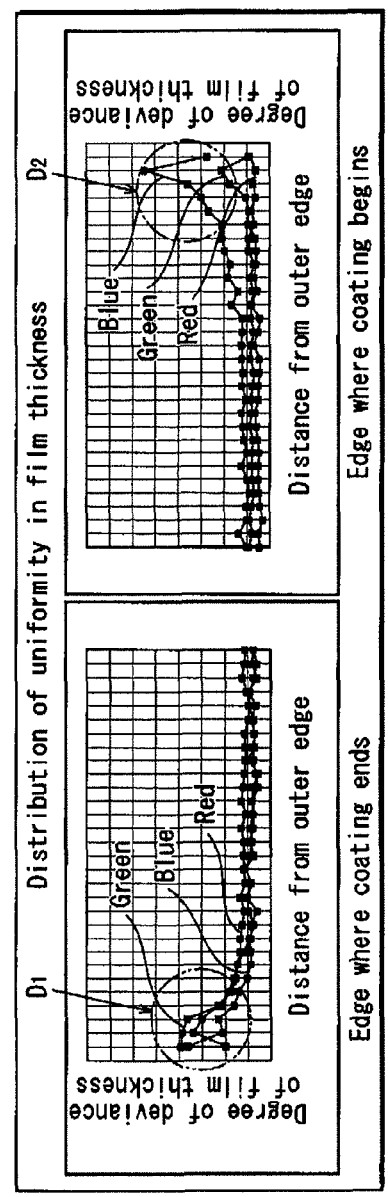
FIG. 17B shows a uniformity distribution of film thickness of an organic light emitting layer in each region of the display panel.

As shown in FIGS. 17A and 17B, in the central region of the panel (central region of the light emitting cell array), the film thickness of the organic light emitting layers 906a and 906b in the light emitting cells is approximately uniform. Therefore, by making the inclination angles of the third side wall and the fourth side wall equivalent, the film thickness of the organic light emitting layer in each light emitting cell located in the central region of the array can be maintained uniform.

Note that the term "equivalent" above does not mean exact mathematical equivalence, but rather takes factors such as tolerance when manufacturing the display device into account. Specifically, the term "equivalent" refers to making the inclination angles of the third side wall and fourth side wall equivalent within the range permitted in practice by the difference in luminous efficiency (uneven luminance) between the light emitting cells throughout the panel.

Furthermore, in the display device according to one aspect of the present invention, in the above structure, the banks may include a third bank that borders the second light emitting cell and is closer to a periphery of the array than the first bank, with a fifth side wall facing the second light emitting cell in the third bank having a larger inclination angle than the second side wall. By adopting this structure, the film thickness of the organic light emitting layer in the second light emitting cell is prevented from becoming thicker at a section corresponding to the fifth side wall due to the above relationship. The film thickness of the organic light emitting layer in all of the light emitting cells can thus be made uniform.

In the display device according to one aspect of the present invention, in the above structure, the inclination angle of the first side wall may be in a range between 35° and 40° inclusive, and the inclination angle of the second side wall may be in a range between 25° and 30° inclusive. By forming the first side wall and the second side wall with these ranges of inclination angles, the film thickness (film shape) of the organic light emitting layer throughout each peripheral light emitting cell can be reliably made uniform.

In the display device according to one aspect of the present invention, in the above structure, the inclination angle of the third side wall and the inclination angle of the fourth side wall may be in a range between 25° and 30° inclusive. By forming the third side wall and the fourth side wall with this range of inclination angle, the film thickness in the organic light emitting layer in the central light emitting cells can be made uniform throughout.

In the above structures, the "inclination angle" is an angle formed by a side wall of the bank and an upper surface of an underlayer on which the bank is provided (the underlayer corresponding to the first electrode, hole injection layer, hole transporting layer, or hole injection transporting layer).

A manufacturing method of a display device according to an aspect of the present invention is for manufacturing a display device comprising an array of a plurality of light emitting cells, the manufacturing method comprising the following steps.

(Step 1) forming, above a substrate, a functional layer that includes a plurality of first electrodes.

(Step 2) layering photoresist material above the functional layer.

(Step 3) forming a plurality of openings corresponding to a plurality of light emitting cells via mask exposure and patterning of the photoresist material, and forming a plurality of banks that partition regions between adjacent openings.

(Step 4) forming an organic light emitting layer by dripping ink that includes organic light emitting material through each of the openings and drying the ink.

(Step 5) forming a plurality of second electrodes above the organic light emitting layer.

Furthermore, in the manufacturing method of a display device according to one aspect of the present invention, the openings include a first opening and a second opening that are located in a peripheral region of the array and are adjacent to one another, and the banks include a first bank that borders a region of the array corresponding to the organic light emitting layer at the first opening and the organic light emitting layer at the second opening.

Also, in the third step, the first bank is formed so that an inclination angle of the first side wall facing the first opening in the first bank is larger than an inclination angle of a side wall facing the second opening in the first bank (hereinafter referred to as "second side wall" for the sake of simplicity).

This manufacturing method can be used to manufacture a display device in which, in the first bank, the first side wall has a larger inclination angle than the second side wall. In a display device manufactured using this method, as described above, a pinning location when ink is dripped during manufacturing into the peripheral opening is higher at the first side wall than the second side wall. Due to the relationship between pinning location and film thickness described above, the film thickness of the organic light emitting layer becomes uniform, and luminance is made even.

Accordingly, the manufacturing method of a display device according to an aspect of the present invention can be used to manufacture a display device that has a uniform film thickness in the organic light emitting layer in light emitting cells at the peripheral region of the panel (peripheral region of the light emitting cell array) and that has an even luminance within the panel.

In the manufacturing method of a display device according to one aspect of the present invention, in the above structure, when performing the third step, a structure may be adopted to make the inclination angle of the first side wall larger than the inclination angle of the second side wall by making an exposure amount of photoresist material in a section corresponding to the first side wall larger than an exposure amount of photoresist material in a section corresponding to the second side wall.

In the manufacturing method of a display device according to one aspect of the present invention, in the above structure, when performing the third step, a structure may be adopted to make the inclination angle of the first side wall larger than the inclination angle of the second side wall by using, during exposure, a mask in which a degree of transparency in a section corresponding to the first side wall is larger than a degree of transparency in a section corresponding to the second side wall. Accordingly, the inclination angle of the first side wall becomes larger than the inclination angle of the second side wall, making it possible to manufacture a display device with little variety in luminance across the panel.

In the manufacturing method of a display device according to one aspect of the present invention, when performing the third step, a structure may be adopted wherein after exposing and developing the photoresist material in a section corresponding to the first side wall and a section corresponding to the second side wall, the photoresist material in the section corresponding to the first side wall is additionally exposed. This method may also be adopted to form the first bank and the second bank so that the inclination angle of the first side wall is larger than the inclination angle of the second side wall.

[Embodiment]

The following describes an example of an embodiment of the present invention with reference to the drawings.

Note that the following Embodiment is simply an example to clearly illustrate a structure of the present invention and the effects and advantages thereof. The present invention is in no way limited to the following Embodiment except in its essential characteristic elements.

(Process by which the Embodiment According to the Present Invention was Achieved)

As a result of intense study, the inventor of the present invention discovered the following with regard to the organic light emitting display device recited in the Background Art.

Normally, as shown in FIG. 17A, an organic light emitting layer 906a, 906c is formed between banks 905 provided above a substrate 901.

The inventor determined that in this case, as shown in FIG. 17B, the organic light emitting layer 906c at the light emitting cell at the peripheral region of the panel tends to have a less uniform film thickness than the organic light emitting layer 906a at the light emitting cell in the central region of the panel (as shown by the lines with alternate long and two short dashes $D_1$ and $D_2$ in FIG. 17B). Specifically, in the light emitting cell located at the peripheral region of the panel, the surface of the organic light emitting layer becomes higher as it approaches the outer periphery of the panel. Note that, in FIG. 17B, the horizontal axis indicates distance from the outer periphery, and the vertical axis indicates the degree of deviance of the film thickness.

Figure 18:
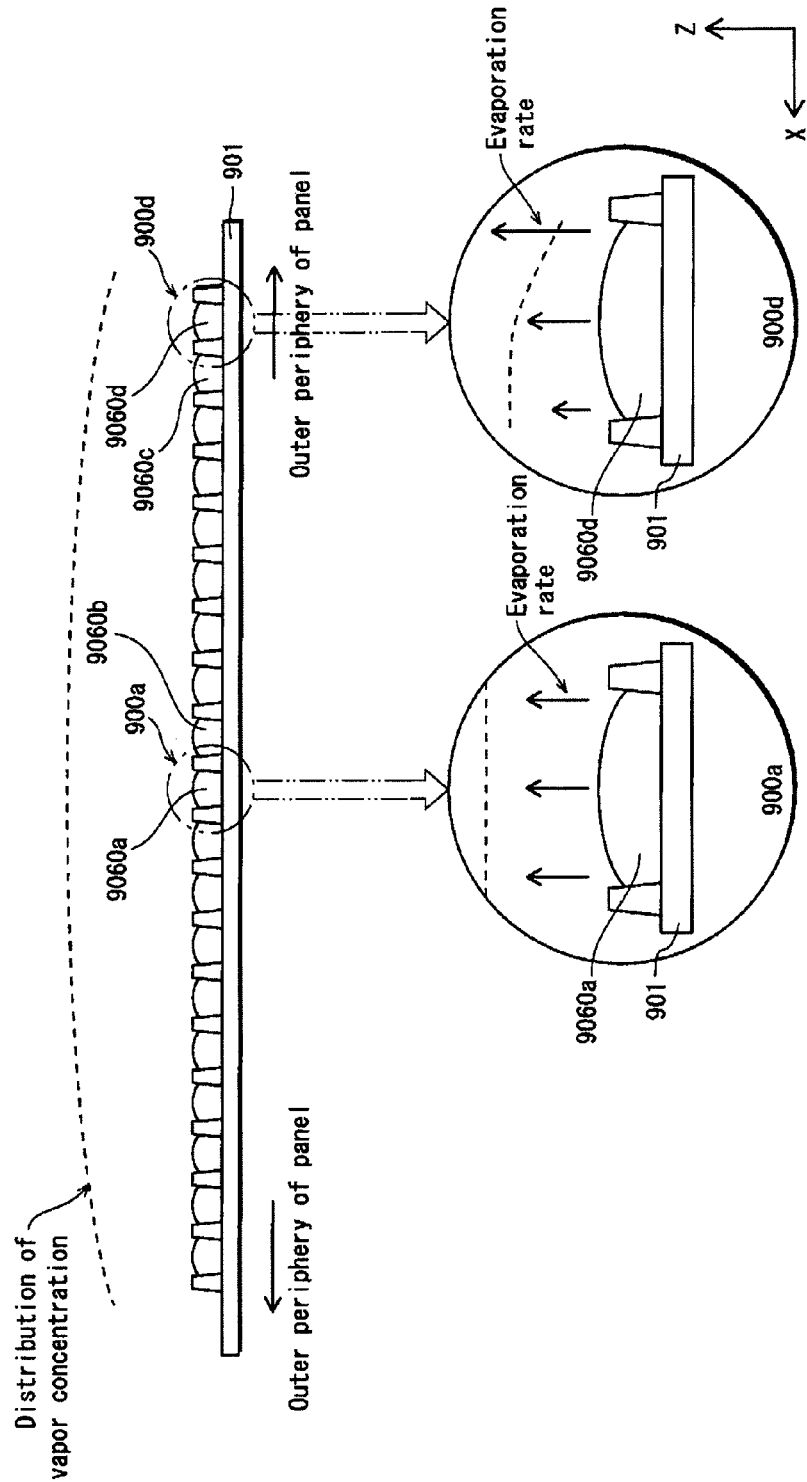
FIG. 18 is a schematic cross-section diagram showing a vapor concentration distribution during a drying process when forming an organic light emitting layer.

After repeated examination of the above phenomenon, the inventor determined that reduction in uniformity of film thickness in the organic light emitting layer causes a non-uniform vapor concentration distribution during ink drying, as described below. Specifically, as shown in FIG. 18, the vapor concentration near the light emitting cells 900b and 900c located at the peripheral region of the panel is lower than the vapor concentration near the light emitting cell 900a located at the central region of the panel. This unevenness in the vapor concentration distribution causes the evaporation rate of solvent from ink dripped in the light emitting cells 900b and 900c in the peripheral region of the panel to become non-uniform (see the lines with alternate long and two short dashes in FIG. 18).

By contrast, the evaporation rate of solvent from ink dripped in the light emitting cell 900a at the central region of the panel is roughly uniform.

Figure 19A:
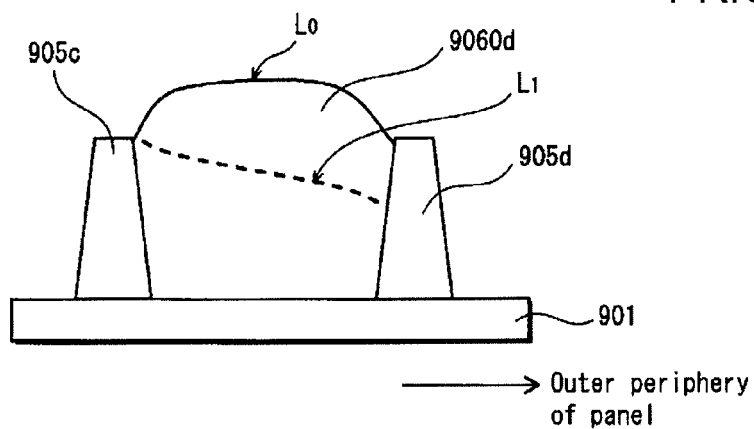
FIG. 19 is a schematic cross-section diagram illustrating the mechanism by which film shape becomes uneven during the drying process.
Figure 19B:
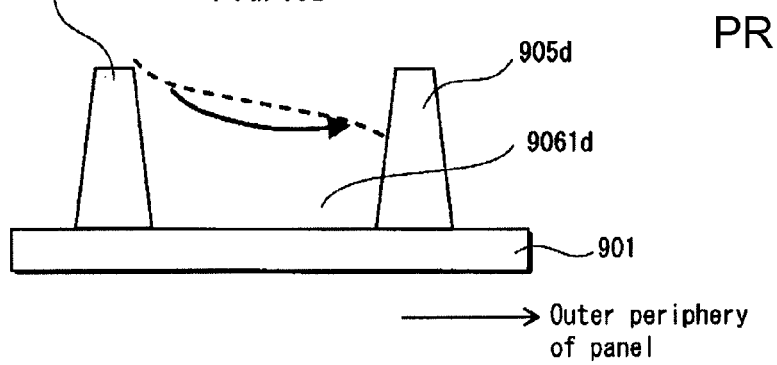
Figure 19C:
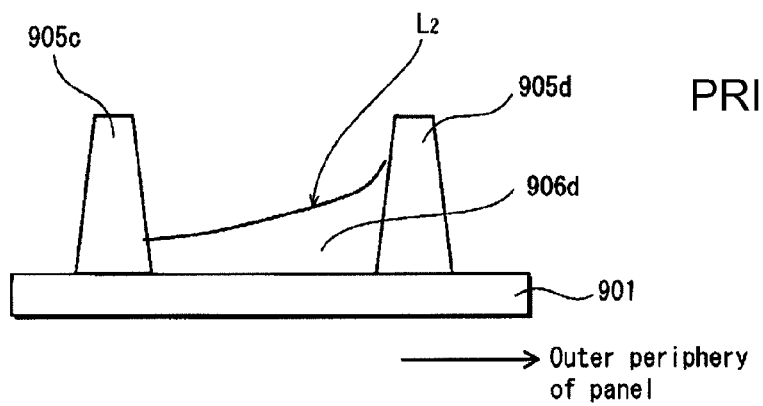

However, as shown in FIG. 19B, solvent in the ink 9061c flows during drying as shown by the solid arrow. This is because solvent flows to compensate for solvent that has evaporated (i.e. flows to minimize surface free energy), and along with the flow of the solvent, the solute (organic light emitting material) also flows. Therefore, as shown in FIG. 19C, in a light emitting cell at the peripheral region of the panel, an organic light emitting layer 906c with a surface profile $L_2$ that swells up towards the exterior forms.

The inventor therefore deduced that, in an organic light emitting display device, uniformity of film thickness of the organic light emitting layer decreases due to non-uniformity of vapor concentration distribution during ink drying in the peripheral region and central region of a panel.

The inventor also discovered technology to vary, within the panel, the pinning location of ink on a bank side wall by varying the inclination angle of the bank side wall, which improves uniformity of film thickness in the organic light emitting layer.

1. Configuration of Display Device 1

The overall structure of the display device 1 according to the present Embodiment is described with reference to FIG. 1.

As shown in FIG. 1, the display device 1 is composed of a display panel unit 10 and a drive control unit 20 connected to the display panel unit 10. The display panel unit 10 is an organic EL panel that uses the phenomenon of electroluminescence occurring in organic material and is composed of an array of a plurality of organic EL elements.

The drive control unit 20 is composed of four drive circuits 21-24 and a control circuit 25.

Note that in an actual display device 1, the placement of the drive control unit 20 with respect to the display panel unit 10 is not limited in this way.

2. Structure of Display Panel 10

Figure 2:
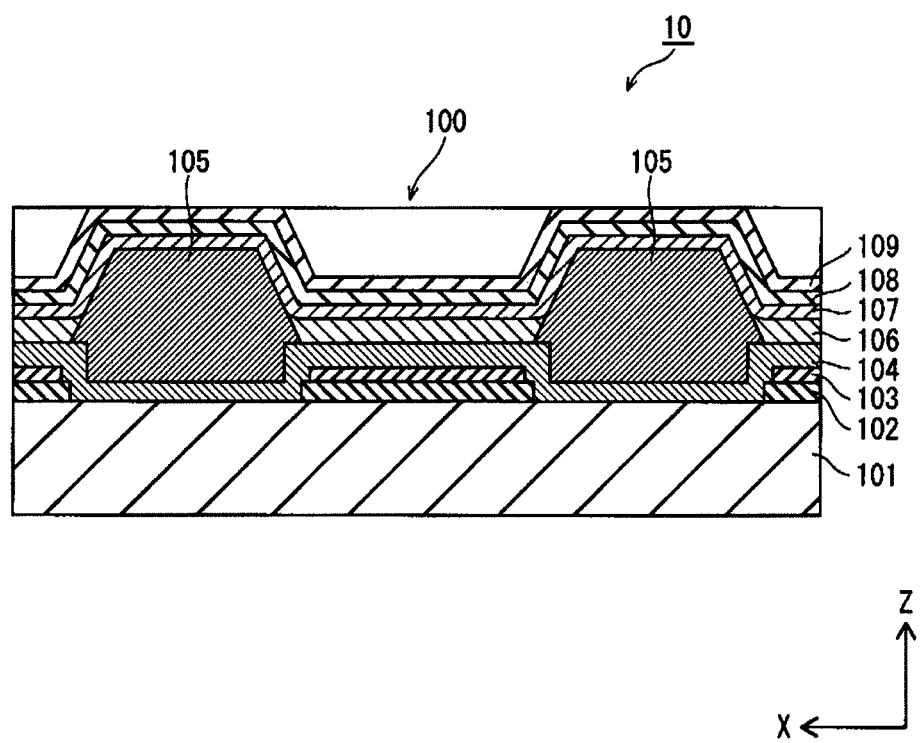
FIG. 2 is a schematic cross-section diagram showing a light emitting cell 100 in a display panel 10.

The structure of the display panel 10 is described with reference to FIG. 2. Note that, as an example, the display panel 10 in the present Embodiment is a top emission type organic EL panel composed of a plurality of light emitting cells 100 that are each provided with an organic light emitting layer having a luminescent color of either red (R), green (G), or blue (B) arranged in a matrix. FIG. 2 depicts one light emitting cell 100.

As shown in FIG. 2, in the display panel 10, an anode 102 is formed above a TFT substrate (hereinafter simply referred to as a "substrate") 101, and an electrode coating layer 103 and hole injection transporting layer 104 are layered above the anode 102 in this order. Note that the anode 102 and electrode coating layer 103 are formed separately for each light emitting cell 100.

The hole injection transporting layer 104 is formed to coat the electrode coating layer 103, and above the hole injection transporting layer 104, banks 105 formed from insulating material are established to partition each light emitting cell 100. An organic light emitting layer 106 is formed in the region in each light emitting cell 100 partitioned by the banks 105, and an electron injection layer 107, cathode 108, and passivation layer 109 are layered above the organic light emitting layer 106 in this order.

a) Substrate 101

The substrate 101 is formed with a base of an insulating material such as alkalifree glass, soda glass, nonfluorescent glass, phosphate glass, borate glass, quartz, acrylic resin, styrenic resin, polycarbonate resin, epoxy resin, polyethylene, polyester, silicon resin, alumina, etc.

b) Anode 102

The anode 102 is composed of a single layer or of a laminate of a plurality of layers of a conductive material, such as Ag (silver), APC (alloy of silver, palladium, and copper), ARA (alloy of silver, rubidium, and gold), MoCr (alloy of molybdenum and chromium), NiCr (alloy of nickel and chromium), etc. Note that in the case of a top emission type panel such as in the present Embodiment, it is preferable that the anode 102 be formed with highly reflective material.

c) Electrode Coating Layer 103

The electrode coating layer 103 is formed, for example, using indium tin oxide (ITO) and covers a surface located above the anode 102 along the Z axis.

d) Hole Injection Transporting Layer 104

The hole injection transporting layer 104 is a layer of an oxide such as silver (Ag), molybdenum (Mo), chromium (Cr), vanadium (V), tungsten (W), nickel (Ni), iridium (Ir), etc. A hole injection transporting layer 104 formed from such a metal oxide has the function of assisting with hole generation and of injecting and transporting holes stably into the organic light emitting layer 106. The hole injection transporting layer 104 has a high work function.

When the hole injection transporting layer 104 is formed from an oxide of a transition metal, a plurality of levels can be occupied since there are a plurality of oxidation numbers. This makes hole injection easy and allows for reduction of driving voltage.

Note that in addition to forming the hole injection transporting layer 104 with the above-described metal oxides, PEDOT (an amalgam of polythiophene and polystyrene sulfonic acid) or the like may also be used.

e) Banks 105

The banks 105 are formed with an organic material such as resin and have insulating properties. Examples of the organic material used to form the banks 105 include acrylic resin, polyimide resin, styrenic resin, polycarbonate resin, novolac-type phenolic resin, etc. It is also preferable that the banks 105 have organic solvent resistance.

Furthermore, since the banks 105 are etched and baked when formed, it is preferable that the banks be formed from highly resistant material that will not change in shape or quality during the etching and baking processes. To provide the banks with liquid repellency, the side walls can be fluoridated.

Note that as the insulating material used in forming the banks 105, any liquid repellent material with a resistivity of $10^5$ Ω·cm can be used, starting with the above materials. Using a material with a resistivity of less than $10^5$ Ω·cm leads to production of leak current between the anode 102 and the cathode 108, or between adjacent light emitting cells 100, which causes a variety of problems such as increased power consumption.

Furthermore, if a hydrophilic material is used to form the banks 105, the difference in affinity/liquid repellency between the side wall of the banks 105 and the surface of the hole injection transporting layer 104 becomes small, and it thus becomes difficult to selectively maintain the ink, which includes an organic substance for forming the organic light emitting layer 106, at the opening of the banks 105.

The structure of the banks 105 need not be a single layer as shown in FIG. 2, but may adopt a two or more layered structure. In such a case, the above materials may be combined for each layer, or layers may alternate between non-organic and organic material.

f) Organic Light Emitting Layer 106

The organic light emitting layer 106 has a function of emitting light when an excitation state is produced by the recombination of holes injected through the anode 102 with electrons injected through the cathode 108. The material used to form the organic light emitting layer 106 needs to be a light emitting organic material, a film of which can be formed by wet printing.

Specifically, it is preferable that the organic light emitting layer 106 be formed from a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488.

g) Electron Injection Layer 107

The electron injection layer 107 has the function of transporting electrons injected through the cathode 108 to the organic light emitting layer 106 and is preferably formed, for example, of barium, phthalocyanine, lithium fluoride, or a combination thereof.

h) Cathode 108

The cathode 108 is formed, for example, of ITO, indium zinc oxide (IZO), etc. In the case of the top-emission type display panel 10, it is preferable that the passivation layer 109 be formed with a transparent material. It is preferable that the degree of transparency be 80% or greater.

The material used to form the cathode 108 may, in addition to the above materials, be for example an alkali metal or alkali earth metal, or a laminate structure having, in the following order, a layer that includes a halide of an alkali metal or alkali earth metal and a layer that includes silver. The layer that includes silver may be formed with silver alone, or with a silver alloy. Also, in order to increase light takeoff efficiency, a highly transparent refraction index adjustment layer may be provided above the layer that includes silver.

i) Passivation Layer 109

The passivation layer 109 has the function of controlling the organic light emitting layer 106 or other layers from being exposed to water or air and is formed, for example, with silicon nitride (SiN), silicon oxynitride (SiON) etc. In the case of the top-emission type display panel 10, it is preferable that the passivation layer 109 be formed with a transparent material.

3. Structure of Banks 105

Figure 3:
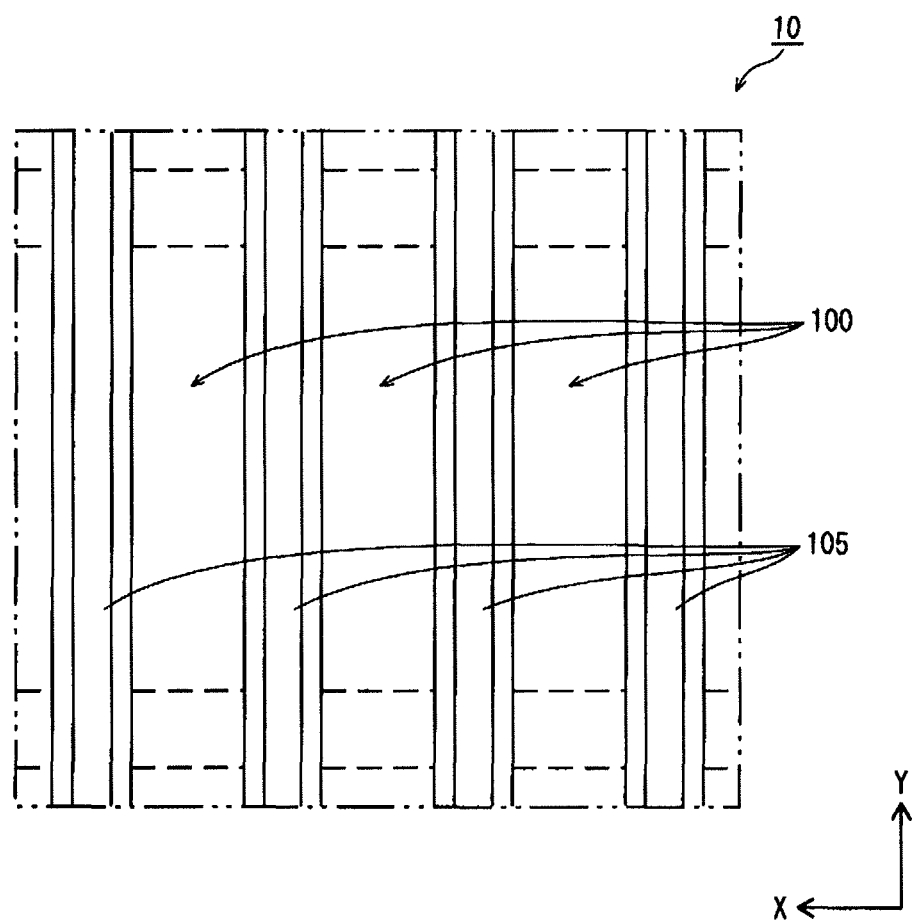
FIG. 3 is a schematic plan view showing a bank 105 in the display panel 10.

As shown in FIG. 3, the banks 105 arranged in a line are adopted as one example in the display panel 10 according to the present Embodiment. Specifically, the banks 105 each extend along the Y axis and partition adjacent light emitting cells 100 along the X axis. The light emitting cells 100 are formed so that adjacent regions partitioned by banks 105 have a different luminescent color.

4. Structure of Banks 105 in Each Region

Figure 4:
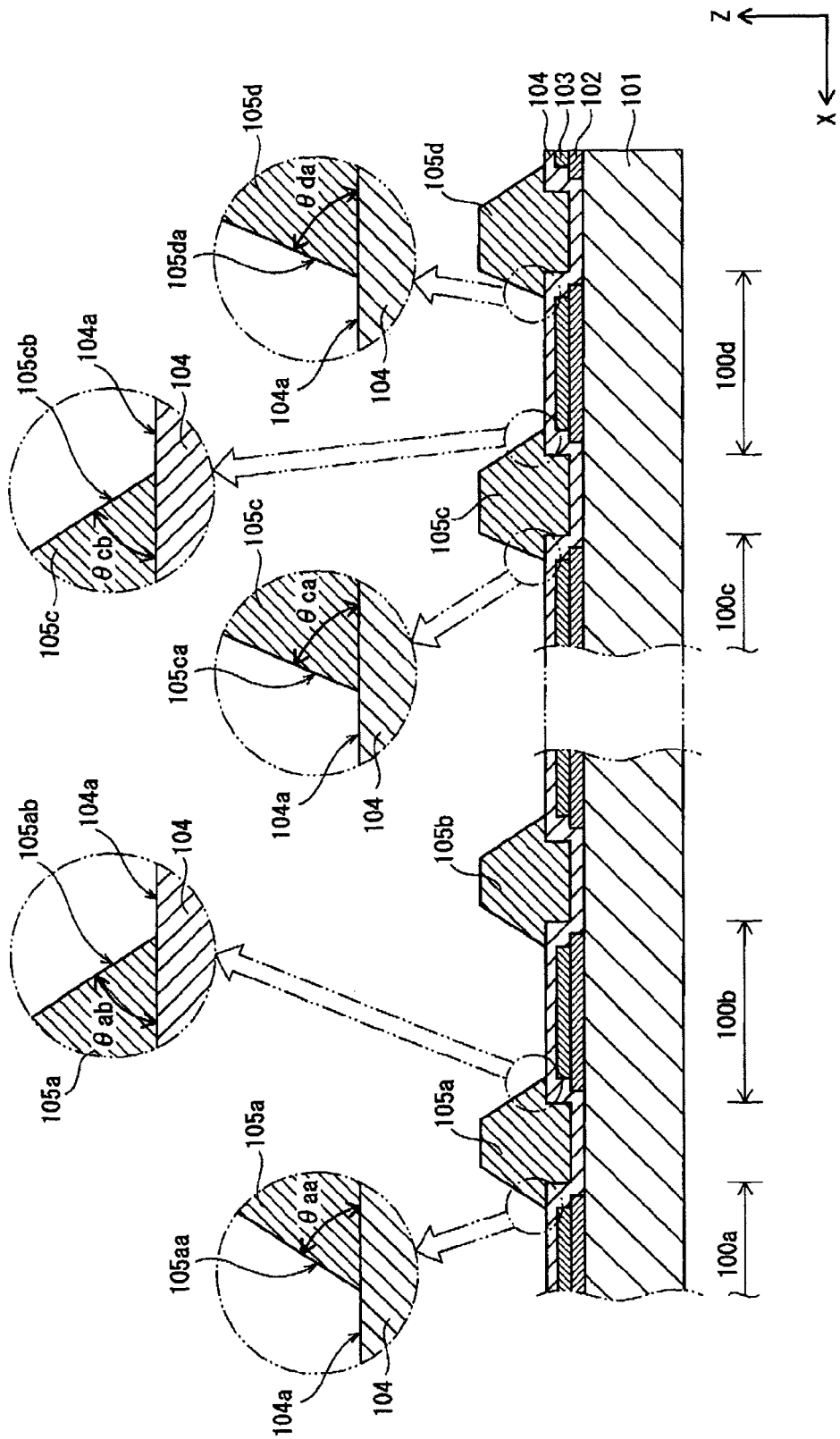
FIG. 4 is a schematic cross-section diagram showing the structure of banks 105a-105f in light emitting cells 100a-100c in the display panel 10.

As shown in FIG. 4, light emitting cells 100a and 100b located in the central region, and light emitting cells 100c and 100d located at the peripheral region (the light emitting cells located at either periphery of a row of light emitting cells) have been extracted from the display panel 10. Banks 105a-105d are provided on either side of these light emitting cells 100a-100d.

The organic light emitting layers (partially omitted from FIG. 4) in the light emitting cell 100a and the light emitting cell 100b are partitioned by a bank 105a. Side walls 105aa and 105ab of the bank 105a respectively form angles θaa and θab with a surface 104a of the underlayer, i.e. the hole injection transporting layer 104.

The organic light emitting layers (partially omitted from FIG. 4) in the light emitting cell 100c and the light emitting cell 100d located at the peripheral region of the panel are partitioned by a bank 105c. Side walls 105ca and 105cb of the bank 105c respectively form angles θca and θcb with the surface 104a of the underlayer, i.e. the hole injection transporting layer 104. The organic light emitting layer of the light emitting cell 100d is further partitioned along the X axis by a bank 105d. A side wall 105da of the bank 105d forms an angle θda with the surface 104a of the underlayer, i.e. the hole injection transporting layer 104. These angles θaa, θab, θca, θcb, and θda satisfy the relationships in the following expressions.

$$\theta ca > \theta cb \qquad \text{[Expression 1]}$$

$$\theta aa = \theta ab \qquad \text{[Expression 2]}$$

$$\theta da > \theta cb \qquad \text{[Expression 3]}$$

Note that in the present Embodiment, the angles θaa, θab, and θcd are within a range of 25° and 30° inclusive, and the angles θca and θda are within a range of 35° and 40° inclusive.

5. Relationship Between Inclination Angle θ of Side Wall of Banks 105 and Film Thickness of Organic Light Emitting Layer 106

The relationship between the inclination angle θ of the side wall of the banks 105 and the film thickness of the organic light emitting layer 106 is described with reference to FIGS. 5 and 6. Note that FIG. 5 is a schematic rendering of the structure of a light emitting cell.

As shown in FIG. 5A, the inclination angle of the side wall of bank 105x (the angle between the side wall and the surface of the hole injection transporting layer 104) is θx, and as shown in FIG. 5B, the inclination angle of the side wall of bank 105y (the angle between the side wall and the surface of the hole injection transporting layer 104) is θy, θx and θy satisfy the following relationship.

$$\theta y > \theta x \quad \text{[Expression 4]}$$

When ink 1060x and ink 1060y, which include organic light emitting material, are dripped into the opening partitioned by the banks 105x and 105y, the pinning locations Px and Py respectively have heights Hx and Hy that satisfy the following relationship.

$$Hy > Hx \quad \text{[Expression 5]}$$

As shown in FIG. 5C, after drying the ink 1060x, the height Hx of the pinning location Px is relatively low, which causes the organic light emitting layer 106x to swell at the central portion of the light emitting cell to a film thickness of Tx.

On the other hand, as shown in FIG. 5D, after drying the ink 1060y, the height Hy of the pinning location Py is relatively high, which causes the organic light emitting layer 106y to sag at the central portion of the light emitting cell to a film thickness of Ty.

The thicknesses Tx and Ty satisfy the following relationship.

$$Tx > Ty \quad \text{[Expression 6]}$$

FIG. 6 summarizes the above relationships. As shown in FIG. 6, as the inclination angle (taper angle) θ of the bank 105 grows smaller, the pinning height H lowers, and as a result, the film thickness T of the organic light emitting layer 106 becomes thicker. Conversely, as the inclination angle (taper angle) θ of the bank 105 grows larger, the pinning height H becomes higher, and as a result, the film thickness T of the organic light emitting layer 106 becomes thinner.

Based on the above factors, five samples were created and evaluated. FIGS. 7 and 8 show the results.

As shown in FIGS. 7 and 8, as compared to the distribution of film thickness of sample 2, the pinning location is higher in samples 3 and 4, which have a larger taper angle. Note that in FIGS. 7 and 8, the horizontal axis represents the horizontal direction, and the vertical axis represents the direction of height.

In sample 5, however, in which the bank has a taper angle (inclination angle) of 50°, the film thickness is less uniform than in sample 2.

6. Manufacturing Method of Display Panel 10

The following describes the characteristic steps of the manufacturing method of the display panel 10 according to the present Embodiment with reference to FIGS. 9 and 10. Note that with regard to the manufacturing processes that are omitted in the following description, any of the variety of processes suggested by conventional technology may be used.

Figure 9A:
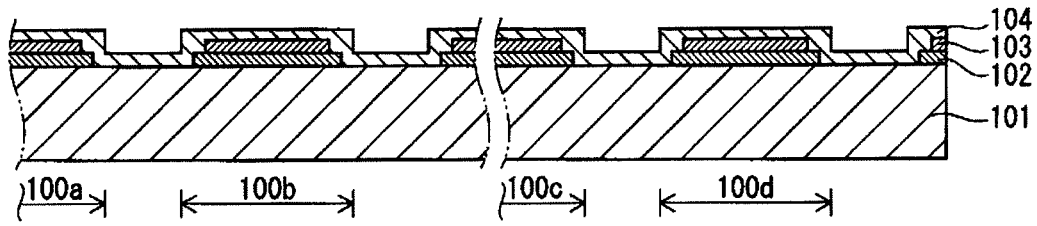
FIGS. 9A, 9B, and 9C are schematic cross-section diagrams showing, in order, the main processes in a manufacturing method of the display panel 10.

First, as shown in FIG. 9A, above the substrate 101 in the direction of the Z axis, anodes 102 and electrode coating layers 103 are layered in this order in regions in which each light emitting cell 100a-100d, . . . is to be formed. A hole injection transporting layer 104 is then layered on top so as to cover the entire surface. The anodes 102 are formed, for example, by first forming a thin Ag film via the sputtering method or vacuum deposition method and then patterning the thin Ag film via photolithography.

The electrode coating layers 103 are formed, for example, by forming a thin ITO film on the surface of the anodes 102 using a method such as the sputtering method and then patterning the thin ITO film via a method such as photolithography. To form the hole injection transporting layer 104, first a metal film is formed on the surface of the substrate 101, including the surface of the electrode coating layer 103, via a method such as the sputtering method. Subsequently, the metal film becomes oxidized, forming the hole injection transporting layer 104.

Figure 9B:
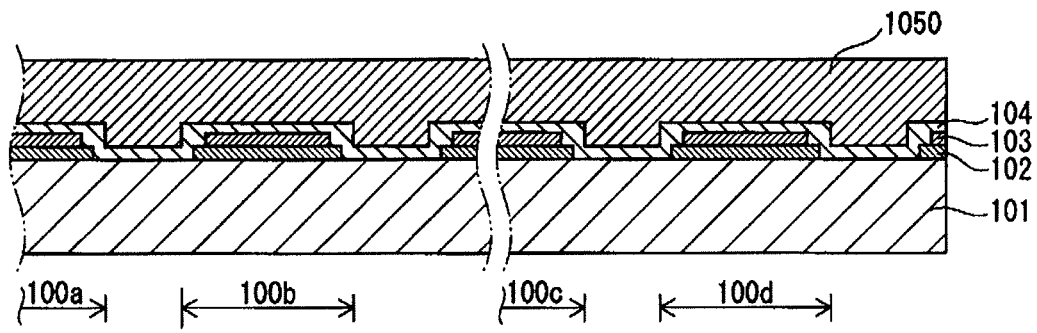

Next, as shown in FIG. 9B, the spin coat method, for example, is used to form a bank material layer 1050 so as to cover the top of the hole injection transporting layer 104.

Photoresist material is used to form the bank material layer 1050. Specifically, as described above, an organic material having insulating properties such as acrylic resin, polyimide resin, novolac-type phenolic resin, etc. can be used.

Figure 9C:
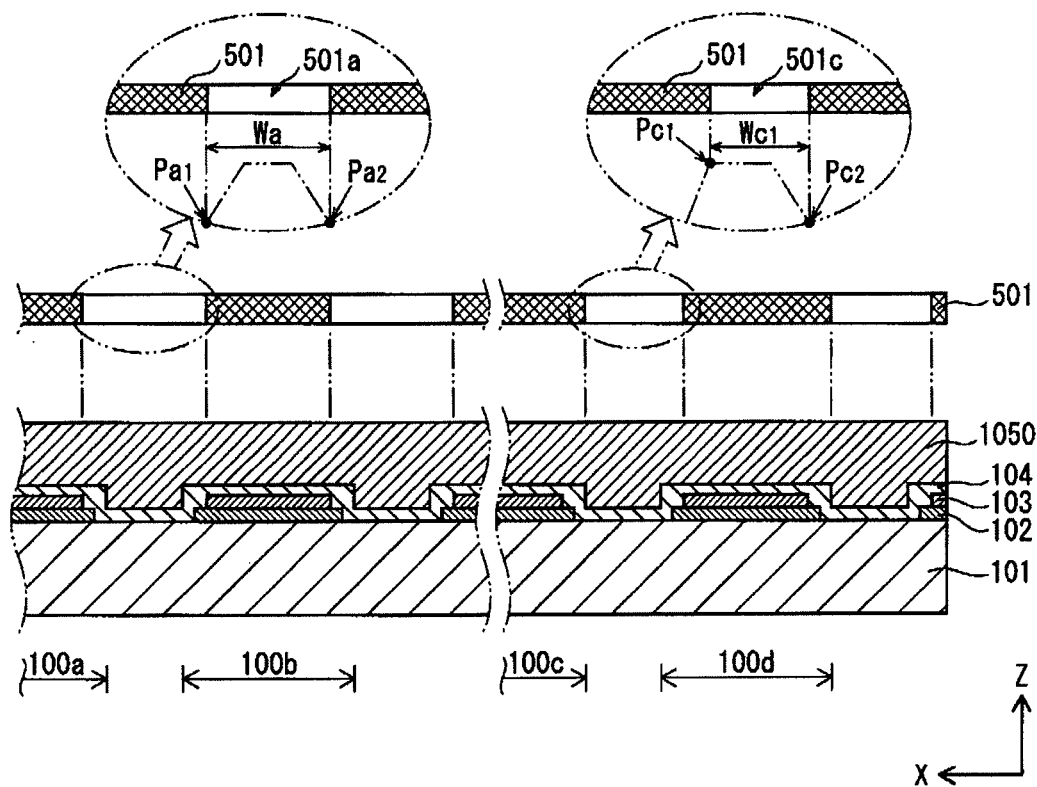

Next, as shown in FIG. 9C, a mask 501 is placed above the bank material layer 1050, the mask 501 having openings 501a and 501c at the locations for forming the banks. Light is exposed through the openings 501a and 501c in the mask 501.

Note that, as shown in FIG. 9C, in the region corresponding to the light emitting cells 100a and 100b located in the central region, a width Wa of the openings 501a in the mask 501 is defined by points Pa1 and Pa2 at the bottom edges of side walls of the banks 105a and 105b (see FIG. 4) that are being formed. On the other hand, in the region corresponding to the light emitting cells 100c and 100d located in the peripheral region, a width Wc1 of the openings 501c in the mask is defined by a point Pc1 at the upper edge of a side wall and a point Pc2 at the foot of a side wall of the banks 105c and 105d (see FIG. 4) that are being formed.

Figure 10A:
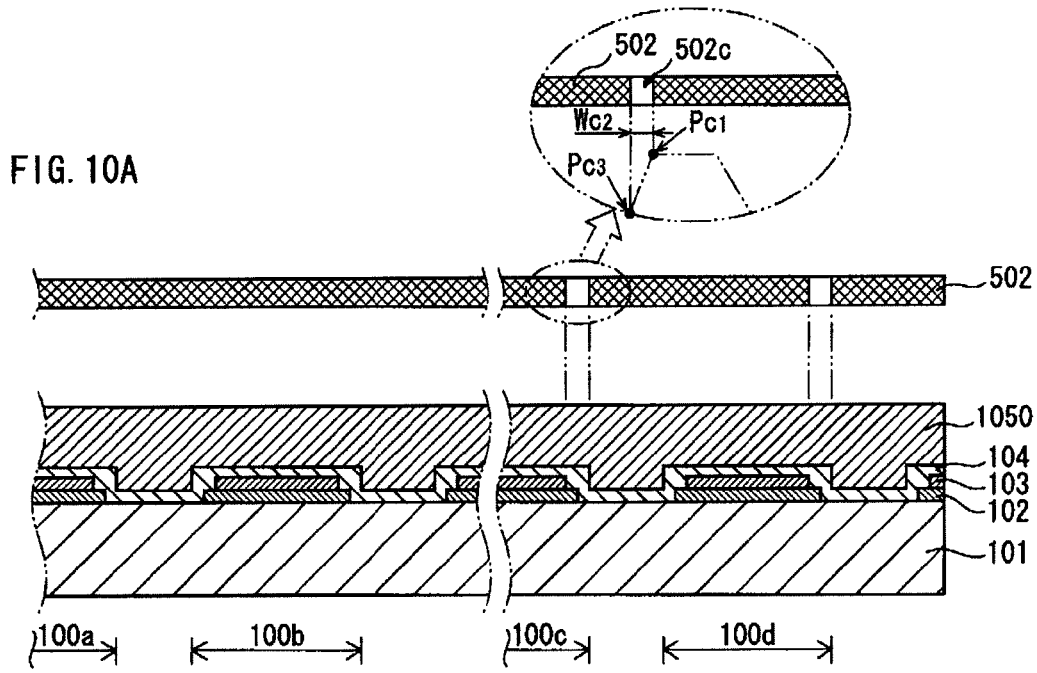
FIGS. 10A, 10B, and 10C are schematic cross-section diagrams showing, in order, the main processes in the manufacturing method of the display panel 10.

Next, as shown in FIG. 10A, above the bank material layer 1050, a mask 502 is placed, the mask 502 having openings 502c at the locations corresponding to side walls 105ca and 105da of the banks 105c and 105d (see FIG. 4), etc. Light is exposed for the second time through the openings 502c in the mask 502.

Note that a width Wc2 of the openings 502c in the mask 502 is defined by a point Pc3 at the bottom edge and the point Pc1 at the upper edge of a side wall of the banks 105c and 105d that are being formed.

Figure 10B:
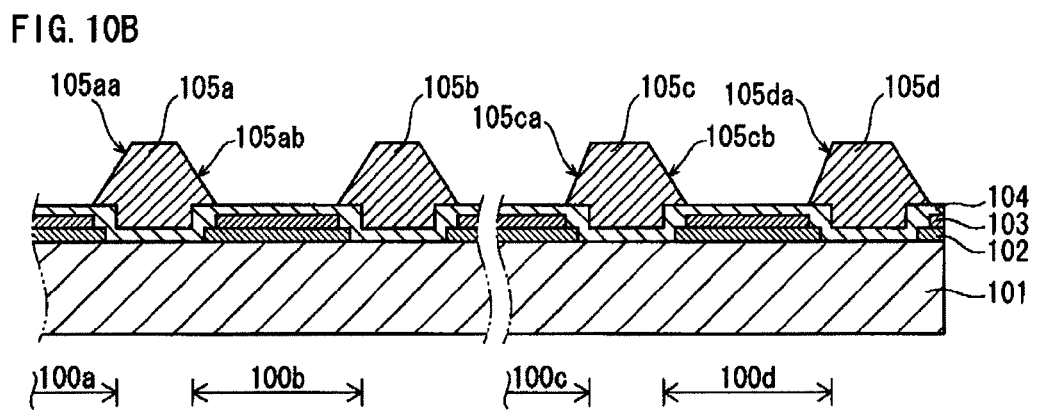

Next, as shown in FIG. 10B, the banks 105a-105d, . . . are formed by development and baking. The side walls 105ca and 105da of the banks 105c and 105d, as described above, have a larger inclination angle than the side wall 105cb of the bank 105c, and the side walls 105aa and 105ab of the banks 105a and 105b have equivalent inclination angles.

Figure 10C:
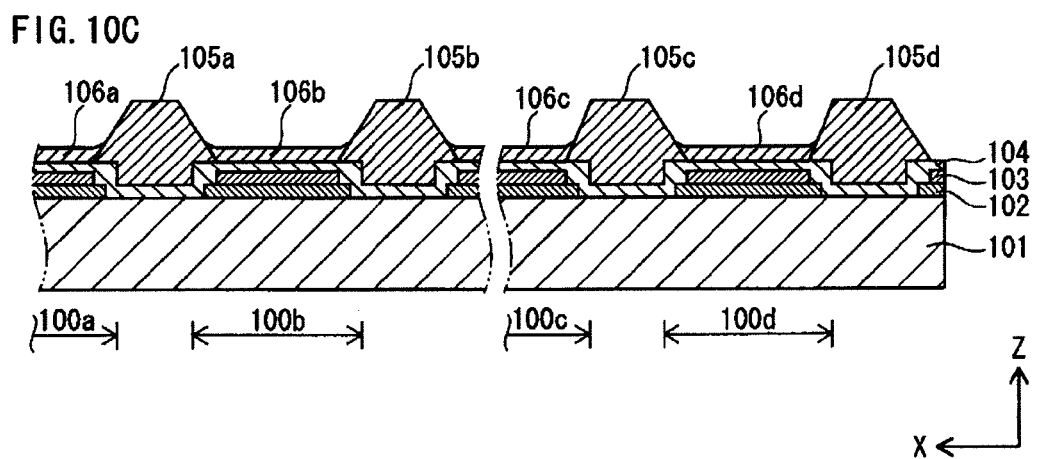

Subsequently, as shown in FIG. 10C, ink that includes an organic light emitting material is dripped into the openings partitioned by the banks 105a-105d, . . . by the inkjet method or other method. By drying the ink, the organic light emitting layer 106a-106d forms.

Note that, although omitted from the drawings, the display panel 10 is formed by layering, in order, the electron injection layer 107, cathode 108, passivation layer 109, etc.

7. Advantageous Effects

As shown in FIG. 4, in the display panel 10 in the display device 1 according to the present invention, in the bank 105c that partitions the organic light emitting layers 106c and 106d (see FIG. 10C) respectively in the light emitting cell 100c and the light emitting cell 100d located at the peripheral region of the panel, inclination angles θca and θcb of the side walls 105ca and 105cb of the bank 105c are set to satisfy the relationship in Expression 1 above, i.e. angle θca is set larger than angle θcb. Accordingly, in the light emitting cells 100c and 100d located in the peripheral region of the panel, when ink is dripped during manufacturing, a pinning location of the ink on the side walls 105ca and 105da becomes higher than a pinning location of the ink on the side wall 105cb.

Accordingly, establishing the above relationship between the inclination angles θca-θda in the side walls 105ca and 105da of the banks 105c and 105d has the effect of controlling the tendency of the film thickness of the organic light emitting layers 106c and 106d, at an edge thereof closer to the outer periphery of the panel, to become thicker in the light emitting cells 100c and 100d (i.e. in the sections corresponding to the side walls 105ca and 105da), which are located at the peripheral region of the panel, due to vapor concentration distribution during ink drying. The film thickness in the organic light emitting layers 106c and 106d in the light emitting cells 100c and 100d located at the peripheral region of the panel can thus be made uniform throughout.

Also, the inclination angles θaa and θab respectively of the side walls 105aa and 105ab in the bank 105a are equivalent, as shown in Expression 2 above. Accordingly, the film thickness of the organic light emitting layer 106 corresponding to the side walls 105aa and 105ab can be made equivalent (even) throughout.

Therefore, in the display panel 10, the film thickness of the organic light emitting layer 106 after drying is uniform between light emitting cells 100a-100d, . . . , which has the advantageous effect of even luminance.

Note that the manufacturing method of the display device 1 according to the present invention as described with reference to FIGS. 9 and 10 can be used to manufacture a display device 1 having these advantageous effects.

Note that, as above, the term "equivalent" does not mean exact mathematical equivalence, but rather takes factors such as tolerance when manufacturing the display device into account. Specifically, the term "equivalent" refers to making the inclination angles equivalent within the range permitted in practice by the difference in luminous efficiency (uneven luminance) between the light emitting cells 100a-100d, . . . in the central region and peripheral region of the panel.

[Modification 1]

Figure 11:
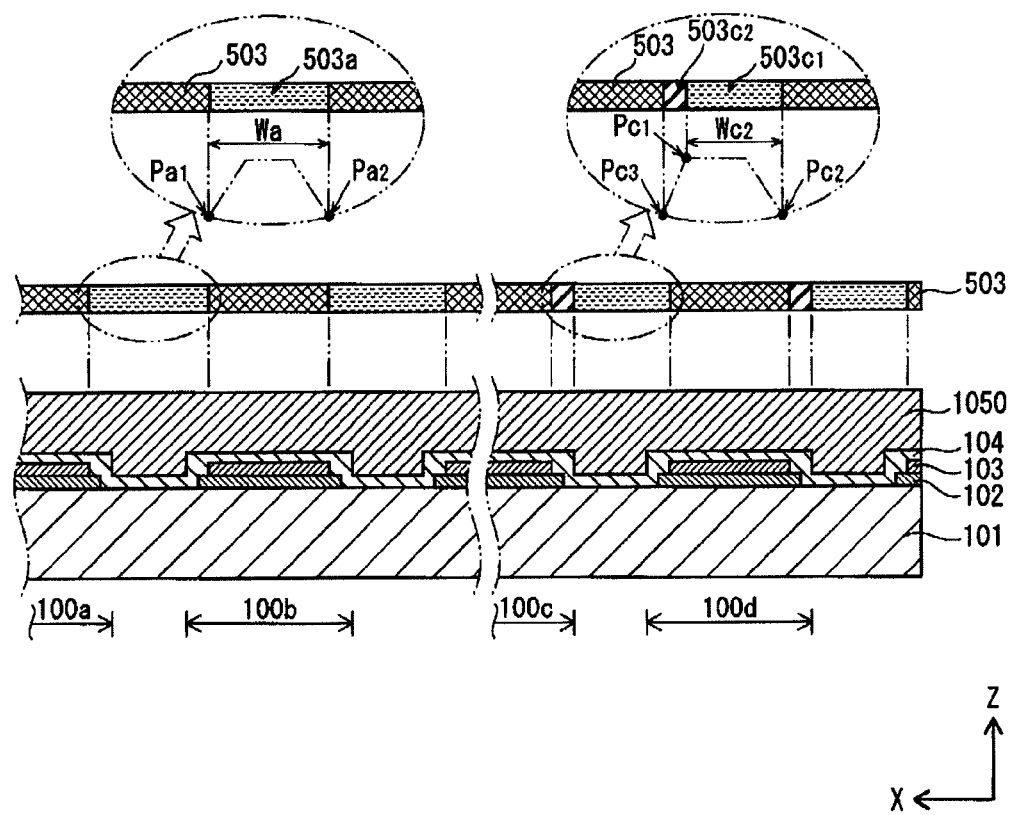
FIG. 11 is a schematic cross-section diagram showing the main processes in the manufacturing method of Modification 1.

Next, with reference to FIG. 11, Modification 1 of the manufacturing method of the display device 1 is described. FIG. 11 shows processes corresponding to the processes shown from FIG. 9C to FIG. 10A.

As shown in FIG. 11, after layering a bank material layer 1050 on top of the hole injection transporting layer 104, a mask 503 is placed above the bank material layer 1050. The mask 503 has optical transmission sections 503a, 503c1, 503c2, . . . . The optical transmission sections 503a, 503c1, 503c2, . . . are provided in correspondence to the locations where the banks 105a-105d, . . . that partition the light emitting cells 100a-100d (see FIG. 4) are to be formed.

In the manufacturing method of the display device 1 according to Modification 1, the width Wa of the optical transmission sections 503a, in the region corresponding to the light emitting cell 100a, is defined by the points Pa1 and Pa2 at the bottom edges of the banks 105a and 105b (see FIG. 4) that are being formed.

On the other hand, the width Wc2 of the optical transmission sections 503c1, in the region corresponding to the light emitting cell 100c, is defined by the point Pc2 at the bottom edge and the point Pc1 at the upper edge of the banks 105c and 105d (see FIG. 4) that are being formed. The optical transmission sections 503c2 are defined by the points Pc3 and Pc1 at the bottom edges of the banks 105e and 105f (see FIG. 4) that are being formed.

The mask 503 is formed using a half-tone or other mask, and the degree of transparency of the optical transmission sections 503a and 503c1 differs from that of the optical transmission sections 503c2. Specifically, the degree of transparency of the optical transmission sections 503c2 is larger than the degree of transparency of the optical transmission sections 503a and 503c1.

The mask 503 with the above-described structure is put in place, and after exposure and development, the banks 105a-105d are formed as shown in FIG. 10B by baking. In other words, at the location exposed to light via the optical transmission section 503c2, which has a larger degree of transparency, the side wall has a larger inclination angle than at the locations exposed to light via the optical transmission sections 503a and 503c1, as in the relationship indicated in Expression 1.

Subsequent processes are the same as the above Embodiment.

With regards to the above relationships for the amount of exposure, note that depending on a variety of conditions, such as the type of photoresist material, which is the structural material for the banks 105, the direction of the inequalities may be reversed.

The display device 1 can be manufactured with this type of manufacturing method.

[Modification 2]

Next, with reference to FIGS. 12 and 13, Modification 2 of the manufacturing method of the display device 1 is described. FIGS. 12 and 13 show processes corresponding to the processes shown from FIG. 9C to FIG. 10B.

As shown in FIG. 12A, after layering a bank material layer 1050 on top of the hole injection transporting layer 104, a mask 504 is placed above the bank material layer 1050. The mask 504 has openings 504a, 504c, . . . corresponding to the sections at which banks 105a-105d, . . . are to be formed.

The openings 504a, provided at locations where the banks 105a and 105b (see FIG. 4) are to be formed in correspondence with the light emitting cells 100a and 100b, are formed to have the same width as the openings 501a in the mask 501 used in the manufacturing method of the above Embodiment. On the other hand, a width Wc3 of the openings 504c, provided at locations where the banks 105c and 105d (see FIG. 4) are to be formed in correspondence with the light emitting cells 100c and 100d, is set to be larger than the width defined by the points Pct and Pc3 at the lower edges of the banks 105c and 105d, as shown by the section surrounded by lines with alternate long and two short dashes in FIG. 12A. Specifically, the width is made larger at the sections where the inclination angle is to be greater.

The mask 504 shown in FIG. 12A is put in place, and exposure and development take place for the first time. As shown in FIG. 12B, bank material layers 1051a-1051d remain in the locations corresponding to the openings 504a and 504c in the mask 504.

Note that, as shown in FIG. 12B, the inclination angles of each side wall in the bank material layers 1051a-1051d are uniform after the first exposure and development. In Modification 2, baking does not take place at this point.

As shown in FIG. 13A, a mask 505 is placed above the bank material layers 1051a-1051d that have formed. Among the locations in the mask 505 corresponding to the side walls of the banks 105a-105d, . . . that are being formed, openings 505c and 505d are provided only at the locations where the inclination angle is to be made larger (in FIG. 4, the side walls 105ca, 105da, . . . ).

With the mask 505 set in place, exposure and development takes place for the second time, and the banks 105a-105d shown in FIG. 13B are formed by baking. In the banks 105c and 105d, the side walls 105ca and 105da to the left along the X axis (closer to the center of the panel) have a larger inclination angle than the other side walls 105aa, 105ab, 105cb, . . . .

Subsequently, the display device 1 can be manufactured by performing the same processes as in the above Embodiment and Modification.

[Verification of Manufacturing Method]

Using a concrete example, the shape of the banks after formation was verified for the manufacturing method according to the above Embodiment and Modifications 1 and 2. The results are described with reference to FIG. 14.

Figure 14A:
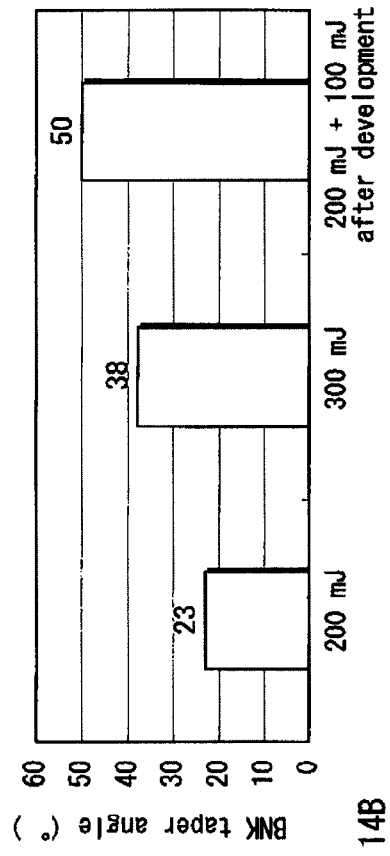
FIG. 14A shows the relationship between the taper angle of a bank and exposure/developing.
Figure 14B:
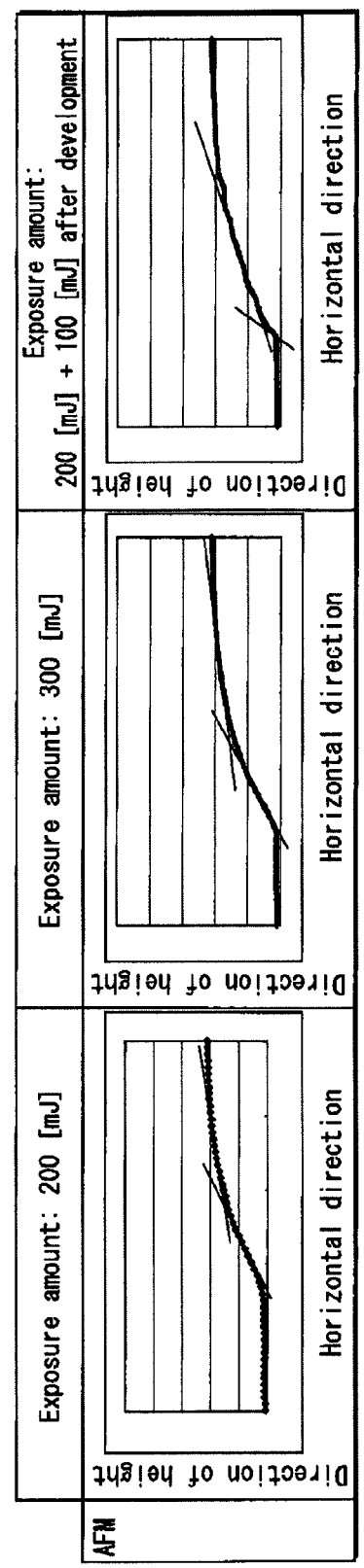
FIG. 14B shows AFM graphs that indicate the shapes of banks.

As shown in FIG. 14, as the exposure amount increases, the inclination angle of the side wall of the bank that is formed becomes larger. Specifically, when exposure and development take place with an exposure amount of 200 mJ, the inclination angle of the side wall of the bank that is formed is 23°, whereas when exposure and development take place with an exposure amount of 300 mJ, the inclination angle of the side wall of the bank that is formed is 38°. This result was also shown by the Atomic Force Microscope (AFM) shown in FIG. 14B.

Furthermore, as shown in FIGS. 14A and 14B, after light exposure and development take place for the first time with an exposure amount of 200 mJ and subsequently for the second time with an exposure amount of 100 mJ, the inclination angle of the side wall of the bank that is formed is 50°. This corresponds to the manufacturing method according to Modification 2 and is considered to be effective for creating a large inclination angle of the bank side wall.

Note that in FIG. 14B, the horizontal axis represents the horizontal direction, and the vertical axis represents the direction of height.

[Other Considerations]

In the above Embodiment and Modifications 1 and 2, structures were adopted by way of example in order to clearly illustrate a structure of the present invention and the effects and advantages thereof. Except for its essential elements, the present invention is not limited to the above structures. For example, in the above Embodiment, as shown in FIG. 2, a structure was adopted by way of example in which anodes 102 are located below the organic light emitting layer 106 in the direction of the Z axis. The present invention is not limited, however, to this structure; a structure may be adopted in which cathodes 108 are located below the organic light emitting layer 106 in the direction of the Z axis.

In the case in which cathodes 108 are located below the organic light emitting layer 106 in the direction of the Z axis, since the panel is a top-emission structure, a structure is adopted in which the cathodes 108 are a reflecting electrode layer, above which the electrode coating layer 103 is formed.

Figure 15:
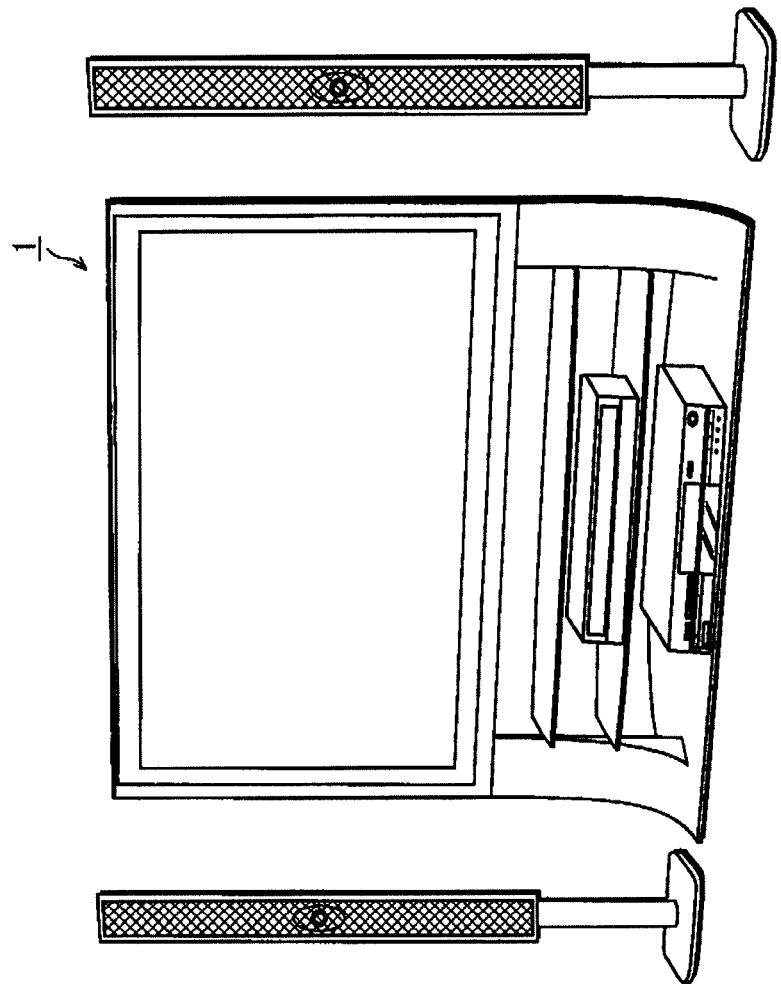
FIG. 15 is an external perspective view showing an example of the appearance of a set that includes the display device 1.

In the above Embodiment and Modifications, a specific example of the appearance of the display device 1 is not shown. The display device 1 may be part of a system as shown, for example, in FIG. 15. Note that an organic EL display device does not require a backlight, as does a liquid crystal display device, and is therefore suitable for producing a thinner display, a superior characteristic from the perspective of system design.

Also, in the above Embodiment and Modifications 1 and 2, a so-called line bank structure is adopted as the shape of the banks 105, as shown in FIG. 3. However, as shown in FIG. 16, a "pixel bank" 305 may be adopted in the structure of a display panel 30, the pixel bank 305 being formed by bank elements 305a that extend in the direction of the Y axis and bank elements 305b that extend in the direction of the X axis.

Figure 16:
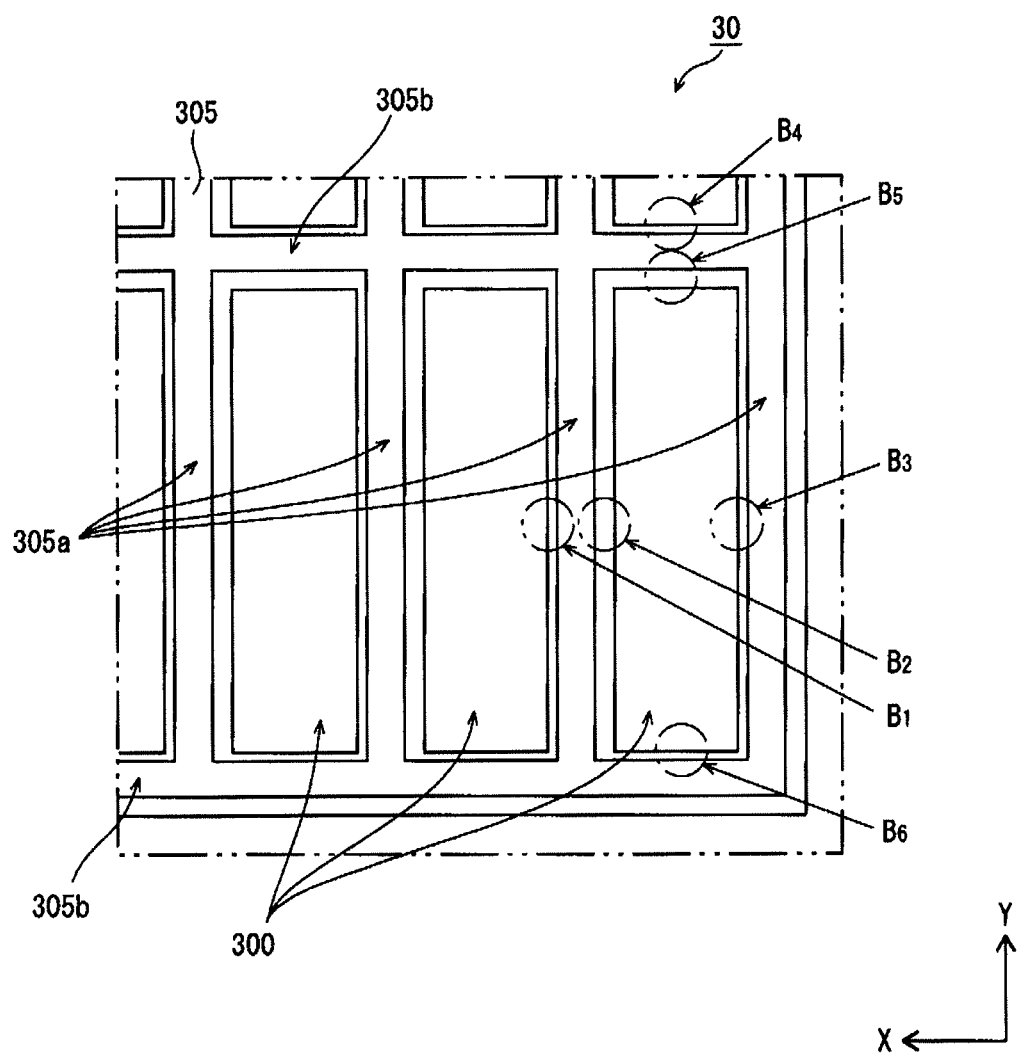
FIG. 16 is a schematic plan view showing the structure of a bank 305 provided in a display panel 30 according to a modification.

As shown in FIG. 16, when using the pixel bank 305, the same advantageous effects as above can be achieved by enlarging the inclination angle of the side walls on each side in the directions of the X axis and the Y axis of the light emitting cell 300 at the peripheral region of the panel. Specifically, in the light emitting cell that is located at the corner of the peripheral region of the panel and has side walls indicated by arrows $B_1$, $B_2$, $B_3$, and $B_4$, the inclination angle of the side walls indicated by the arrows $B_1$ and $B_3$ should be made larger than the inclination angle of the side wall indicated by the arrow $B_2$, and the inclination angle of the side walls indicated by the arrows $B_4$ and $B_6$ should be made larger than the inclination angle of the side wall indicated by the arrow $B_5$.

In the above Embodiment and Modifications 1 and 2, the inclination angle of the side walls of the banks at the peripheral region of the panel are made larger than the inclination angle of the side walls of the banks at the central region of the panel. However, this relationship may be varied according to the flow of vapor (vapor concentration) during the drying process in the formation of the organic light emitting layer at the time of manufacturing. For example, if the flow of vapor during drying of the ink is from the outer periphery of the panel towards the central region of the panel due to some factor such as the structure of the drying device, then the inclination angle of the bank side walls may be made larger at locations where the film thickness of the organic light emitting layer becomes thicker. The film thickness of the organic light emitting layer can thus be made uniform, which has the advantageous effect of making luminance more even throughout the panel.

While no distinction is made between the luminescent colors (red, green, blue) of the light emitting cells in the above Embodiment and in Modifications 1 and 2, the characteristics of the ink included in the organic light emitting material change according to luminescent color. The inclination angle of the corresponding bank side wall can be specified in accordance with the ink characteristics of each luminescent color.

The region in which the inclination angle of the bank side wall is increased may be varied according to the manufacturing process, panel size, etc. It is considered preferable, however, for this region to encompass light emitting cells located, for example, in a range of 0.5% to a few percentage points (e.g. 1%) of the peripheral region of the panel. This range is based on a consideration of variety in film thickness of the organic light emitting layer in a display device according to conventional technology.

INDUSTRIAL APPLICABILITY

The present invention is useful for achieving a display device that exhibits even luminance and is capable of high image quality.

What is claimed is:

1. A display device, comprising:
an array of a plurality of light emitting cells, each of the plurality of light emitting cells including a first electrode, a second electrode, and an organic light emitting layer located between the first electrode and the second electrode; and
a plurality of banks above the first electrode that partition the organic light emitting layer to define each of the plurality of light emitting cells,
wherein the plurality of light emitting cells includes a first light emitting cell and a second light emitting cell that are adjacent to one another and located in a peripheral region of the array, the first light emitting cell being closer to a center of the array than the second light emitting cell,
the plurality of banks includes a first bank that borders the first light emitting cell and the second light emitting cell, an inclination angle of a first sidewall of the first bank that is adjacent the first light emitting cell is greater than an inclination angle of a second sidewall of the first bank that is adjacent the second light emitting cell, the organic light emitting layer of the first light emitting cell extends along the first sidewall of the first bank and the organic light emitting layer of the second light emitting cell extends along the second sidewall of the first bank, and the inclination angle of each of the first sidewall and the second sidewall of the first bank is an angle formed by a corresponding one of the first sidewall and the second sidewall of the first bank and an underlayer from which each of the first sidewall and the second sidewall inclines.

2. The display device of claim 1, wherein

The plurality of light emitting cells include a third light emitting cell and a fourth light emitting cell that are adjacent to one another and located in a central region of the array, the plurality of banks includes a second bank that borders the third light emitting cell and the fourth light emitting cell, and an inclination angle of a first sidewall of the second bank that is adjacent the third light emitting cell is approximately equal to an inclination angle of a second sidewall of the second bank that is adjacent the fourth light emitting cell.

3. The display device of claim 2, wherein the inclination angle of the first sidewall of the second bank and the inclination angle of the second sidewall of the second bank are at least approximately 25° and at most approximately 30°.

4. The display device of claim 1, wherein the plurality of light emitting cells include a second bank that borders the second light emitting cell, the second bank being closer to a periphery of the array than the first bank, and an inclination angle of a first sidewall of the second bank that is adjacent the second light emitting cell is greater than the inclination angle of the second sidewall of the first bank.

5. The display device of claim 1, wherein the inclination angle of the first sidewall of the first bank is at least approximately 35° and at most approximately 40°, and the inclination angle of the second sidewall of the first bank is at least approximately 25° and at most approximately 30°.

6. A display device, comprising:

an array of a plurality of light emitting cells, each of the plurality of light emitting cells including a first electrode, a second electrode, and an organic light emitting layer located between the first electrode and the second electrode; and a plurality of banks above the first electrode that partition the organic light emitting layer to define each of the plurality of light emitting cells, wherein the plurality of light emitting cells includes a first light emitting cell and a second light emitting cell that are adjacent to one another and located in a peripheral region of the array, the first light emitting cell being closer to a center of the array than the second light emitting cell, the plurality of banks includes a first bank that borders the first light emitting cell and the second light emitting cell, an inclination angle of a first sidewall of the first bank that is adjacent the first light emitting cell is greater than an inclination angle of a second sidewall of the first bank that is adjacent the second light emitting cell, and the inclination angle of each of the first sidewall and the second sidewall of the first bank is an angle formed by a corresponding one of the first sidewall and the second sidewall of the first bank and a surface of an underlayer on which the first bank is provided.

7. The display device of claim 6, wherein the plurality of light emitting cells include a third light emitting cell and a fourth light emitting cell that are adjacent to one another and located in a central region of the array, the plurality of banks includes a second bank that borders the third light emitting cell and the fourth light emitting cell, and an inclination angle of a first sidewall of the second bank that is adjacent the third light emitting cell is approximately equal to an inclination angle of a second sidewall of the second bank that is adjacent the fourth light emitting cell.

8. The display device of claim 7, wherein the inclination angle of the first sidewall of the second bank and the inclination angle of the second sidewall of the second bank are at least approximately 25° and at most approximately 30°.

9. The display device of claim 6, wherein the plurality of light emitting cells include a second bank that borders the second light emitting cell, the second bank being closer to a periphery of the array than the first bank, and an inclination angle of a first sidewall of the second bank that is adjacent the second light emitting cell is greater than the inclination angle of the second sidewall of the first bank.

10. The display device of claim 6, wherein the inclination angle of the first sidewall of the first bank is at least approximately 35° and at most approximately 40°, and the inclination angle of the second sidewall of the first bank is at least approximately 25° and at most approximately 30°.

11. A manufacturing method of a display device that includes an array of a plurality of light emitting cells, the manufacturing method comprising:

forming, above a substrate, a functional layer that includes a plurality of first electrodes;

layering photoresist material above the functional layer;

forming a plurality of openings that correspond to the plurality of light emitting cells and a plurality of banks above the plurality of the first electrode that partition the plurality of openings via mask exposure and patterning of the photoresist material;

forming an organic light emitting layer by dripping ink that includes organic light emitting material into each of the plurality of openings and drying the ink; and forming a plurality of second electrodes above the organic light emitting layer, wherein the plurality of openings includes a first opening and a second opening that are adjacent to one another and located in a peripheral region of the array, the first opening being closer to a center of the array than the second opening, the plurality of banks includes a first bank that borders the first opening and the second opening, when forming the plurality of openings and the plurality of banks, the first bank is formed such that an inclination angle of a first sidewall of the first bank that is adjacent the first opening is greater than an inclination angle of a second sidewall of the first bank that is adjacent the second opening, the organic light emitting layer of the first opening extends along the first sidewall of the first bank and the organic light emitting layer of the second opening extends along the second sidewall of the first bank, and the inclination angle of each of the first sidewall and the second sidewall of the first bank is an angle formed by a corresponding one of the first sidewall and the second sidewall of the first bank and an underlayer from which each of the first sidewall and the second sidewall inclines.

12. The manufacturing method of claim 11, wherein, when forming the plurality of openings and the plurality of banks, the first bank is formed such that the inclination angle of the first sidewall of the first bank is greater than the inclination angle of the second sidewall of the first bank by exposing a first section of the photoresist material corresponding to the first sidewall of the first bank more than a second section of the photoresist material corresponding to second sidewall of the first bank during exposure of the photoresist material.

13. The manufacturing method of claim 11, wherein, when forming the plurality of openings and the plurality of banks, the first bank is formed such that the inclination angle of the first sidewall of the first bank is greater than the inclination angle of the second sidewall of the first bank by using, during exposure of the photoresist material, a mask in which a first degree of transparency in a first section corresponding to the first sidewall of the first bank is greater than a second degree of transparency in a second section corresponding to the second sidewall of the first bank.

14. The manufacturing method of claim 11, wherein, when forming the plurality of openings and the plurality of banks, the first bank is formed such that the inclination angle of the first sidewall of the first bank is greater than the inclination angle of the second sidewall of the first bank by:

exposing the photoresist material in a first section corresponding to the first sidewall of the first bank and in a second section corresponding to the second sidewall of the first bank; and additionally exposing the photoresist material in the first section after exposing the photoresist material in the first section and the second section.

* * * * *